(12) United States Patent
Wang et al.

(10) Patent No.: US 11,056,478 B2
(45) Date of Patent: Jul. 6, 2021

(54) METAL GATE STRUCTURE CUTTING PROCESS

(71) Applicant: Taiwan Semiconductor Manufacturing Co., Ltd., Hsinchu (TW)

(72) Inventors: Shiang-Bau Wang, Pingzchen (TW); Ryan Chia-Jen Chen, Chiayi (TW); Shu-Yuan Ku, Zhubei (TW); Ming-Ching Chang, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 103 days.

(21) Appl. No.: 16/203,755

(22) Filed: Nov. 29, 2018

(65) Prior Publication Data

US 2019/0109126 A1  Apr. 11, 2019

Related U.S. Application Data

(62) Division of application No. 15/809,898, filed on Nov. 10, 2017, now Pat. No. 10,269,787.

(Continued)

(51) Int. Cl.
  *H01L 27/02* (2006.01)
  *H01L 29/423* (2006.01)
  (Continued)

(52) U.S. Cl.
  CPC .... *H01L 27/0207* (2013.01); *H01L 21/31053* (2013.01); *H01L 21/31111* (2013.01); *H01L 21/32139* (2013.01); *H01L 21/76224* (2013.01); *H01L 21/823431* (2013.01); *H01L 21/823437* (2013.01); *H01L 21/823481* (2013.01); *H01L 27/0886* (2013.01); *H01L 29/0649* (2013.01); *H01L 29/42372* (2013.01); *H01L 29/4958* (2013.01); *H01L 29/4966* (2013.01);
  (Continued)

(58) Field of Classification Search
  CPC ........... H01L 29/0649; H01L 29/66545; H01L 21/823437; H01L 21/31053
  See application file for complete search history.

(56) References Cited

U.S. PATENT DOCUMENTS 8,846,491 B1 *  9/2014  Pham ................ H01L 21/02104
                                                             438/424
9,520,482 B1  12/2016  Chang et al.
(Continued)

FOREIGN PATENT DOCUMENTS

CN      106711045 A    5/2017
KR      20160137305 A  11/2016

*Primary Examiner* — Stephen M Bradley
*Assistant Examiner* — Wasiul Haider
(74) *Attorney, Agent, or Firm* — Slater Matsil, LLP

(57) ABSTRACT

Methods for cutting (e.g., dividing) metal gate structures in semiconductor device structures are provided. A dual layer structure can form sub-metal gate structures in a replacement gate manufacturing processes, in some examples. In an example, a semiconductor device includes a plurality of metal gate structures disposed in an interlayer dielectric (ILD) layer disposed on a substrate, an isolation structure disposed between the metal gate structures, wherein the ILD layer circumscribes a perimeter of the isolation structure, and a dielectric structure disposed between the ILD layer and the isolation structure.

20 Claims, 24 Drawing Sheets

Related U.S. Application Data

(60) Provisional application No. 62/526,956, filed on Jun. 29, 2017.

(51) Int. Cl.
    *H01L 29/49* (2006.01)
    *H01L 21/8234* (2006.01)
    *H01L 21/311* (2006.01)
    *H01L 21/762* (2006.01)
    *H01L 27/088* (2006.01)
    *H01L 21/3105* (2006.01)
    *H01L 21/3213* (2006.01)
    *H01L 29/06* (2006.01)
    *H01L 21/027* (2006.01)
    *H01L 29/66* (2006.01)
    *H01L 21/285* (2006.01)

(52) U.S. Cl.
    CPC .... *H01L 21/0276* (2013.01); *H01L 21/28556* (2013.01); *H01L 21/823418* (2013.01); *H01L 27/088* (2013.01); *H01L 29/6656* (2013.01); *H01L 29/66545* (2013.01); *H01L 29/66636* (2013.01)

(56) References Cited

U.S. PATENT DOCUMENTS

| | | |
|---|---|---|
| 9,613,959 B2 | 4/2017 | Wang |
| 9,659,786 B2 | 5/2017 | Greene et al. |
| 2014/0319623 A1* | 10/2014 | Tsai ................ H01L 29/42364 257/401 |
| 2016/0056181 A1* | 2/2016 | Anderson ............ H01L 21/845 257/347 |
| 2016/0133632 A1 | 5/2016 | Park et al. |
| 2016/0181360 A1 | 6/2016 | Wang |
| 2016/0247728 A1* | 8/2016 | You ................ H01L 21/823807 |
| 2016/0343706 A1 | 11/2016 | Chang et al. |
| 2017/0018437 A1 | 1/2017 | Greene et al. |
| 2017/0033196 A1* | 2/2017 | Greene ............ H01L 21/28114 |
| 2017/0084723 A1* | 3/2017 | Greene ................ H01L 29/785 |
| 2017/0125411 A1 | 5/2017 | Yu et al. |
| 2017/0141210 A1 | 5/2017 | Yang |
| 2017/0154779 A1 | 6/2017 | Hsieh |
| 2019/0259852 A1* | 8/2019 | Alptekin ............... H01L 29/665 |

\* cited by examiner

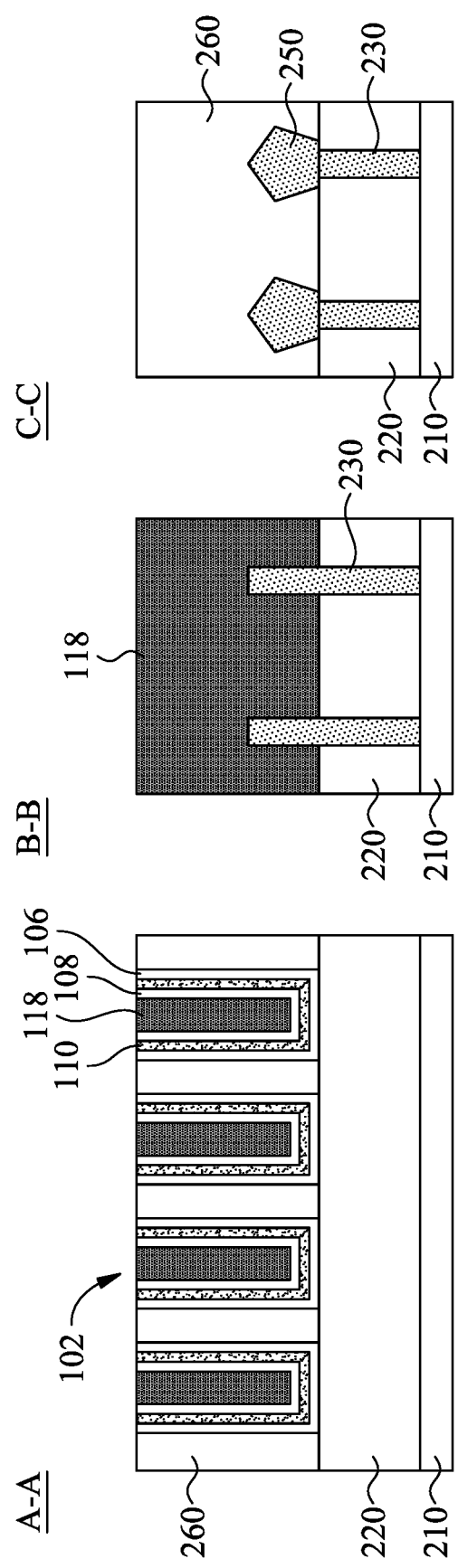

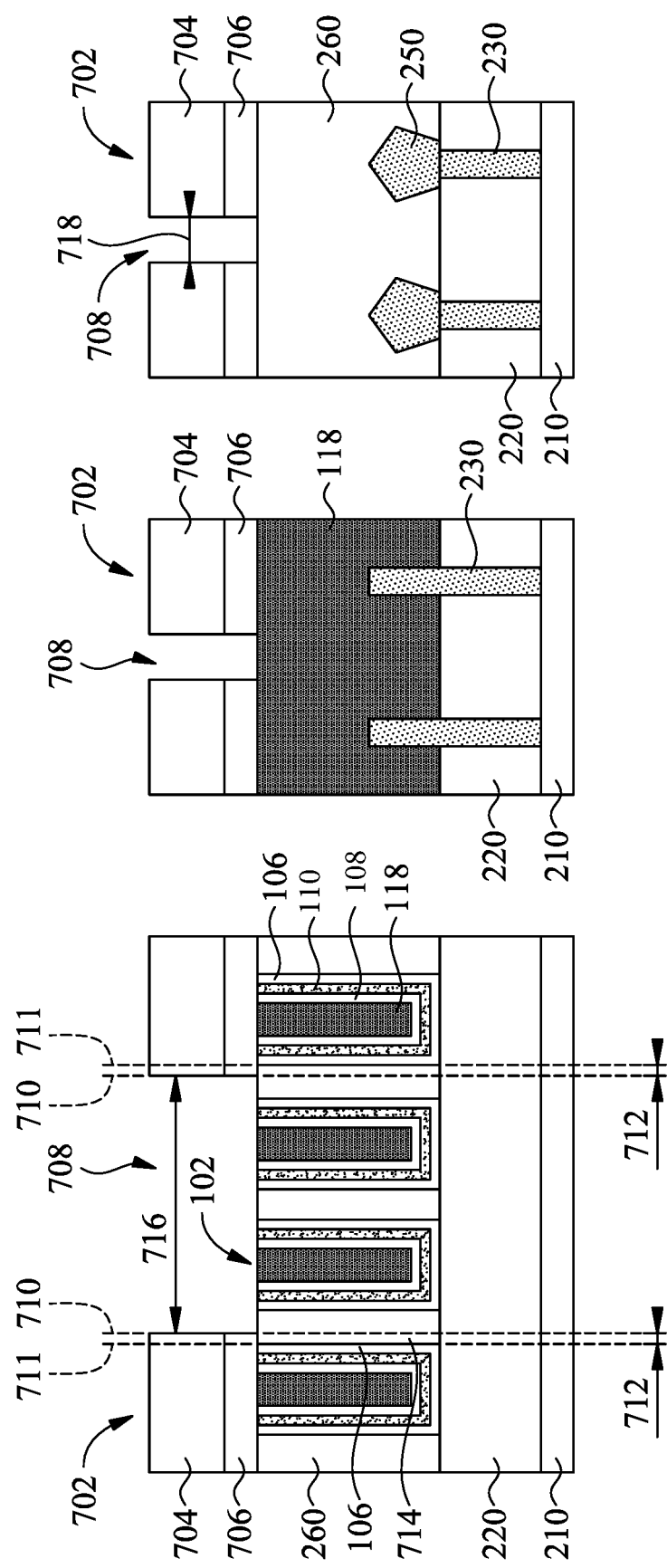

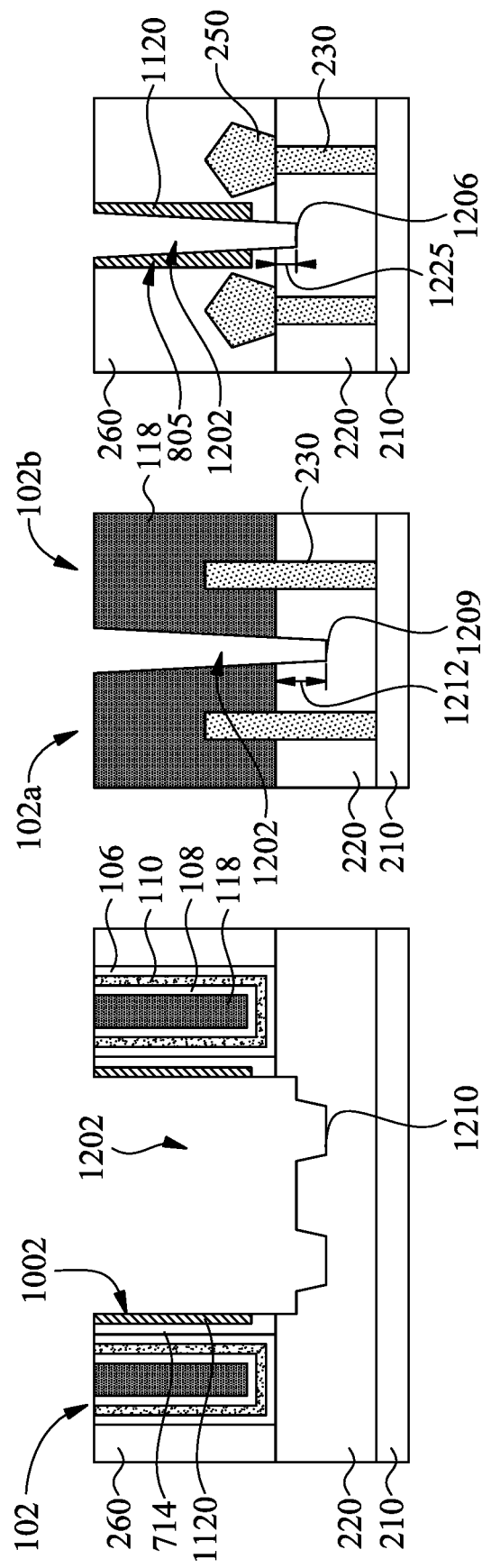

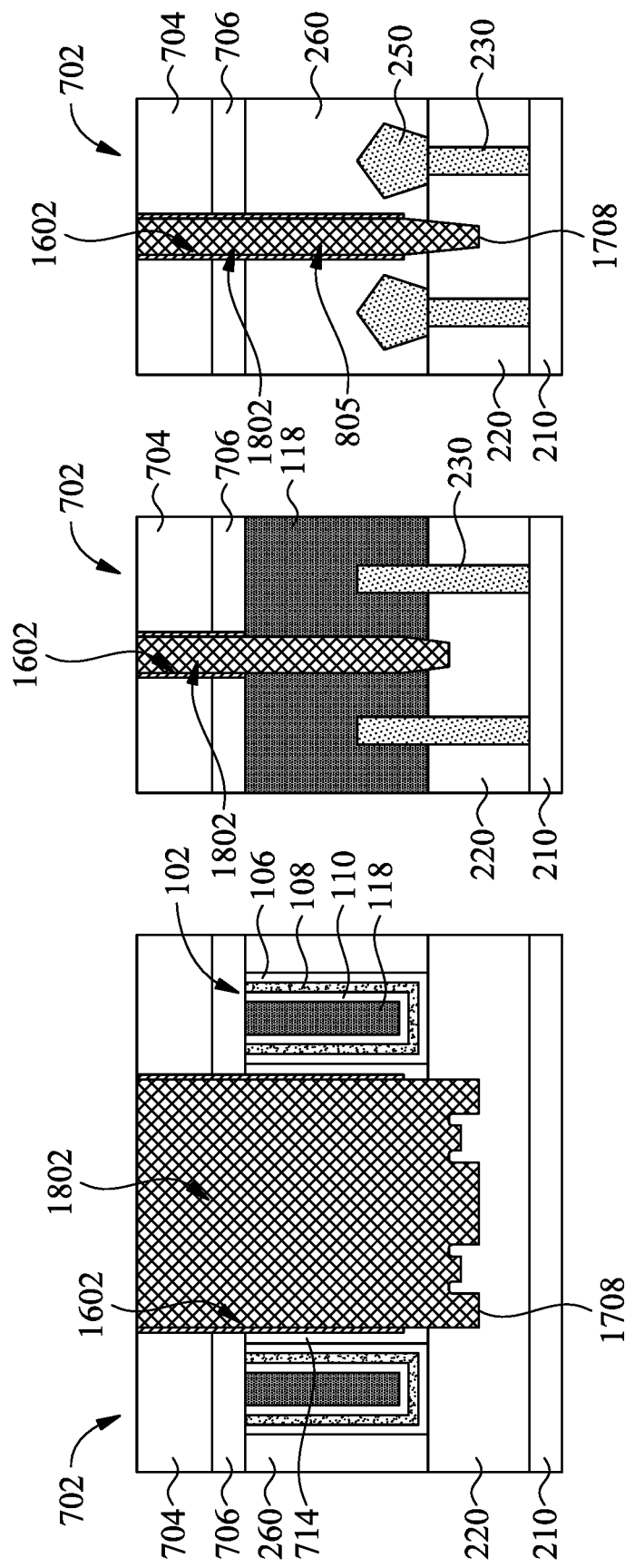

METAL GATE STRUCTURE CUTTING PROCESS

CROSS-REFERENCE TO RELATED APPLICATIONS

This application is a divisional of U.S. application Ser. No. 15/809,898 filed Nov. 10, 2017, entitled "Metal Gate Structure Cutting Process," now U.S. Pat. No. 10,269,787, which claims benefit of U.S. Provisional Application No. 62/526,956 filed Jun. 29, 2017, which is incorporated by reference in its entirety

BACKGROUND

As the semiconductor industry has progressed into nanometer technology process nodes in pursuit of higher device density, higher performance, and lower costs, challenges from both fabrication and design have resulted in the development of three dimensional designs, such as fin field effect transistors (FinFETs). A typical FinFET is fabricated with a fin structure extending from a substrate, for example, by etching into a silicon layer of the substrate. The channel of the FinFET is formed in the vertical fin. A gate structure is provided over (e.g., overlying to wrap) the fin structure. It is beneficial to have a gate structure on the channel allowing gate control of the channel around the gate structure. FinFET devices provide numerous advantages, including reduced short channel effects and increased current flow.

One advancement implemented as technology nodes shrink, in some FinFET device designs, has been the replacement of the typically polysilicon gate electrode with a metal gate electrode to improve device performance with the decreased feature sizes. Although existing methods of fabricating FinFET devices have been generally adequate for their intended purposes, they have not been entirely satisfactory in all respects. For example, challenges rise in manufacturing a metal electrode line with different dimensions for different device performance requirements.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 6A-6C depict cross sectional views of a semiconductor device structure at certain manufacturing stages of FIG. 4 in accordance with some embodiments;

FIGS. 7A-7C depict cross sectional views of a semiconductor device structure at certain manufacturing stages of FIG. 4 in accordance with some embodiments;

FIGS. 18A-18C depict cross sectional views of a semiconductor device structure at certain manufacturing stages of FIG. 15 in accordance with some embodiments;

DETAILED DESCRIPTION

Figure 1:
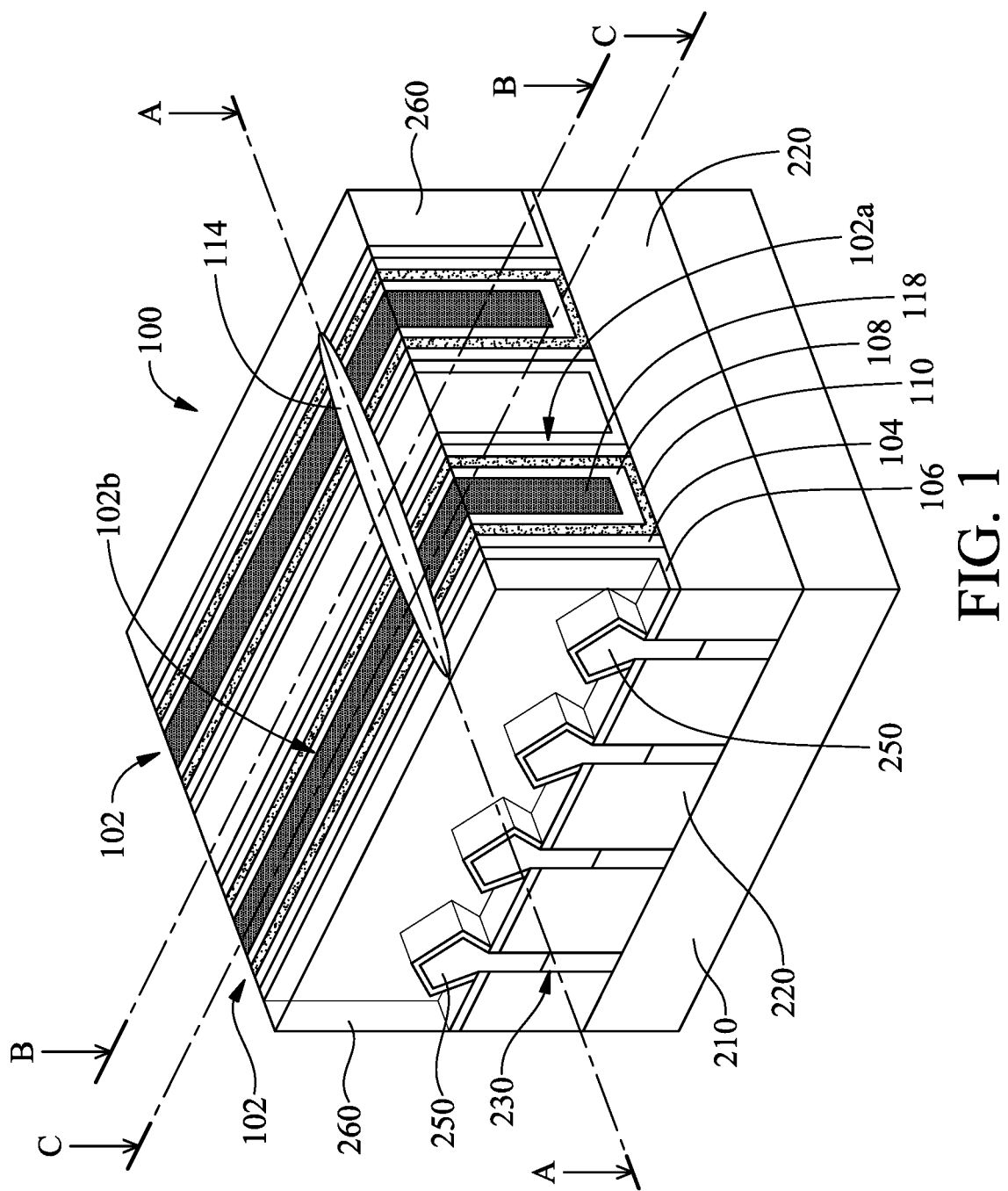
FIG. 1 depicts a perspective view of FinFET devices in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is generally related to semiconductor devices, and more particularly to cut a gate structure after the metal gate structure is formed in semiconductor devices. The present disclosure provides methods for cutting (e.g., dividing) metal gate structures to provide desired longitudinal lengths of the sub-metal gate structures in a replacement gate manufacturing processes. Some examples described herein are in the context of FinFETs. In other implementations, replacement gates and processes in accordance with some embodiments may be implemented in vertical, gate all around (VGAA) devices, horizontal, gate all around (HGAA) devices, or other devices. Further, embodiments may be implemented in any advanced technology node, such as 16 nm, 10 nm, 7 nm, 5 nm, and below.

Generally, in a replacement gate process for forming a metal gate for a transistor, a dummy gate stack is formed over a substrate as a placeholder for an actual gate stack later formed thereon. A spacer structure is formed surrounding the dummy gate stack. After source/drain features and an interlayer dielectric (ILD) are formed adjacent to the spacer structure, the dummy gate stack is removed, leaving an opening surrounded by the spacer structure and ILD. Then, a metal gate is formed in the opening defined by the spacer structure and ILD.

The metal gate structure can include a gate dielectric layer such as a high-k dielectric layer, a work function metal layer, and a gate metal electrode. Multiple deposition and patterning processes may be used to form the work function metal layer, for example, to fine tune threshold voltage (Vt) of the transistor. In some embodiments, the work function metal layer may utilize different materials for different types of transistors, such as p-type FinFET or n-type FinFET, so as to enhance device electrical performance as needed.

After the metal gate structure is formed, a metal gate structure cutting process may be performed to divide the metal gate structure into sub-metal gate structures with desired longitudinal length and/or width. FIG. 1 depicts a perspective view of the semiconductor device structure 100 having metal gate structures 102 formed on a substrate 210 after a metal gate structure cutting process is performed.

In one example, the substrate 210 includes materials selected from at least one of crystalline silicon (e.g., Si<100> or Si<111>), silicon oxide, strained silicon, silicon germanium, doped or undoped polysilicon, doped or undoped silicon wafers and patterned or non-patterned wafers silicon on insulator (SOI), carbon doped silicon oxides, silicon nitride, doped silicon, germanium, gallium arsenide, glass and sapphire. In the embodiment wherein a SOI structure is utilized for the substrate 210, the substrate 210 may include a buried dielectric layer disposed on a silicon crystalline substrate. In the embodiments depicted herein, the substrate 210 is a silicon containing material, such as crystalline silicon substrate. Moreover, the substrate 210 is not limited to any particular size, shape or materials.

The substrate 210 may be a round/circular substrate having a 200 mm diameter, a 300 mm diameter or other diameters, such as 450 mm, among others. The substrate 210 may also be any polygonal, square, rectangular, curved or otherwise non-circular workpiece, such as a polygonal glass substrate as needed.

The semiconductor device structure 100 is formed on a substrate 210 that includes other structures formed therein, such as isolation features 220 with diffusion regions (e.g., active regions) formed there between and/or a fin structure 230 formed between shallow trench isolation structures (e.g., a FINFET structure), or any other suitable structures utilized in a semiconductor substrate.

In one example, the semiconductor device structure 100 includes an n-type FinFET or a p-type FinFET. The p-type FinFET may be doped with p-type dopants, such as boron or $BF_2$. The n-type FinFET may be doped with n-type dopants, such as phosphorus, arsenic, or a combination thereof. The semiconductor device 100 may be included in an integrated circuit (IC) such as a microprocessor, memory device, and/or other IC. The semiconductor device structure 100 includes the plurality of fin structures 230 and the metal gate structures 102 disposed over each of the fin structures 230. Each of the plurality of fin structures 230 include source/drain features 250 where a source or drain feature is formed in, on, and/or surrounding the fin structures 230.

Each fin structure 230 provides an active region where one or more devices are formed. The fin structures 230 are fabricated using suitable processes including masking, photolithography, and/or etch processes. In an example, a mask layer is formed overlying the substrate 210. The photolithography process includes forming a photoresist layer (resist) overlying the mask layer, exposing the photoresist layer to a pattern, performing a post-exposure bake process, and developing the photoresist layer to pattern the photoresist layer. The pattern of the photoresist layer is transferred to the mask layer using a suitable etch process to form a masking element. The masking element may then be used to protect regions of the substrate 210 while an etch process forms recesses into the substrate, leaving an extending fin, such as the fin structures 230. Numerous other embodiments of methods to form a fin structure on a substrate may be utilized.

In an embodiment, the fin structures 230 are approximately 10 nanometer (nm) wide and between approximately 10 nm and 60 nm in height, such as about 50 nm high. However, it should be understood that other dimensions may be used for the fin structures 230. In one example, the fin structures 230 comprise silicon materials or another elementary semiconductor, such as germanium, a compound semiconductor including silicon carbide, gallium arsenic, gallium phosphide, indium phosphide, indium arsenide, and/or indium antimonide. The fin structures 230 may also be an alloy semiconductor including SiGe, GaAsP, AlInAs, AlGaAs, GaInAs, GaInP, GaInAsP, or a combination thereof. The fin structures 230 may be doped using n-type and/or p-type dopants as needed. In some embodiments, the fin structures 230 are formed by any suitable process including various deposition, photolithography, and/or etching processes. As an example, the fin structures 230 are formed by patterning and etching a portion of the substrate 210.

The substrate 210 may also include various isolation features 220, such as shallow trench isolation (STI). As described, in an example, the plurality of fin structures 230 may be formed by etching a portion of the substrate 210 away to form recesses in the substrate 210. The recesses may then be filled with isolating material to form the isolation features 220. Other fabrication techniques for the isolation features 220 and/or the fin structure 230 are possible. The isolation features 220 may isolate some regions of the substrate 210, e.g., active areas in the fin structures 230. In an example, the isolation features 220 may be shallow trench isolation (STI) structures and/or other suitable isolation structures. The STI structures may be formed of silicon oxide, silicon nitride, silicon oxynitride, fluoride-doped silicate glass (FSG), a low-k dielectric material, and/or other suitable insulating material. The STI structures may include a multi-layer structure, for example, having one or more liner layers. The filled recess may have a multi-layer structure such as a thermal oxide liner layer with silicon nitride filling the opening.

Sidewall spacers 104 are disposed along the sidewalls of the metal gate structure 102. The sidewall spacers 104 may include a dielectric material such as silicon oxide. The sidewall spacers 104 may also include silicon nitride, silicon carbide, silicon oxynitride, or a combination thereof. The etching stop layer 106 is also formed on the substrate 210 covering the source/drain (S/D) features 250 lining against the sidewall spacers 104. The etching stop layer 106 may also be formed by a dielectric material that has a different film property than the nearby structures, such as the sidewall spacers 104 and an interlayer dielectric (ILD) layer 260 so as to improve the etching selectivity when an etching process is performed to manufacture the device 100. In one example, the etching stop layer 106 may include silicon nitride, silicon carbide, silicon oxynitride, or combinations thereof.

Source/drain (S/D) features 250 are formed over the substrate 210, beside the metal gate structure 102 (with the sidewall spacers 104 and an etch stop layer 106). In some embodiments, the source/drain feature 250 is a source feature, and another source/drain feature 250 is a drain feature. The source/drain features 250 are separated by the metal gate structure 102. In one embodiment, a portion of the fin structure 230, beside the metal gate structure 102 is recessed to form S/D recesses and then the S/D features 250 are formed over in the S/D recesses by epitaxial growing processes, including chemical vapor deposition (CVD) deposition techniques (e.g., vapor-phase epitaxy (VPE) and/or ultra-high vacuum CVD (UHV-CVD)), molecular beam epitaxy, and/or other suitable processes. The S/D features 250 may include Ge, Si, GaAs, aluminum gallium arsenide (AlGaAs), SiGe, gallium arsenide phosphide (GaAsP), GaSb, InSb, indium gallium arsenide (InGaAs), InAs, or other suitable materials. After the S/D recesses are filled with the S/D feature 250, further epitaxial growth of a top layer of the S/D features 250 expands horizontally and facets may start to form, such as diamond shape facets. The S/D features 250 may be in-situ doped during the epi processes. In some embodiments, the S/D feature 250 is not in-situ doped, and an implantation process is performed to dope the S/D feature 250. One or more annealing processes may be performed to activate dopants. The annealing processes comprise rapid thermal annealing (RTA) and/or laser annealing processes.

The interlayer dielectric (ILD) layer 260 is disposed on the etching stop layer 106 between each of the metal gate structure 102 and over the S/D features 250. The ILD layer 260 may be deposited by CVD, atomic layer deposition (ALD), spin-on coating, or other suitable techniques. The ILD layer 260 may include silicon oxide, silicon nitride, oxynitride, a dielectric material having a dielectric constant (k) lower than silicon oxide (therefore referred to as low-k dielectric material layer), and/or other suitable dielectric material layer. The ILD layer 260 may include a single layer or multiple layers. During manufacturing of the ILD layer 260, a CMP may be performed to polish back the ILD layer 260 to a desired height that allows the metal gate structure 102 to be formed therein with similar height and device performance.

The metal gate structure 102 is formed wrapping over a portion of the fin structures 230 on the substrate 210. In the present embodiment, the metal gate structure 102 is formed on the substrate 210 by replacing a dummy gate stack previously formed as a placeholder on the substrate 210 to define the locations for where the metal gate structure 102 to be formed. The metal gate structure 102 includes a work function metal layer 108 formed on a gate dielectric layer 110. A metal gate electrode 118 is disposed on the work function metal layer 108. However, numerous other layers, such as an interface layer, liner layer, barrier layer, or other suitable layers, may be included in the metal gate structure 102 as needed. The gate dielectric layer 110 of the gate structure 102 may include silicon dioxide. The silicon dioxide may be formed by suitable oxidation and/or deposition methods. Alternatively, the gate dielectric layer 110 of the gate structure 102 may include a high-k dielectric layer such as hafnium oxide ($HfO_2$), $TiO_2$, HfZrO, $Ta_2O_3$, $HfSiO_4$, $ZrO_2$, $ZrSiO_2$, combinations thereof, or other suitable material. The high-k dielectric layer may be formed by atomic layer deposition (ALD) and/or other suitable methods.

The work function metal layer 108 is formed for tuning the work function of the later formed metal gate structures 102 in an NMOS or a PMOS. Thus, work function metal layer 108 may be p-type work function metal materials for PMOS devices or n-type work function metal materials for NMOS devices. Suitable examples of the p-type work function metals, which may have a work function ranging between 4.8 eV and 5.2 eV, include TiN, TaN, Ru, Mo, Al, WN, $ZrSi_2$, $MoSi_2$, $TaSi_2$, $NiSi_2$, WN, other suitable p-type work function metal materials, and combinations thereof. Suitable examples of the n-type work function metal materials, which may have a work function ranging between 3.9 eV and 4.3 eV, include Ti, Ag, TaAl, TaAlC, HfAl, TiAl, TiAlN, TaC, TaCN, TaSiN, Mn, Zr, other suitable n-type work function metal materials, or combinations thereof.

A work function value is associated with the material composition of the work function metal layer 108. The material of the work function metal layer 108 is chosen to tune a work function value so that a desired threshold voltage (Vt) is achieved in the device that is to be formed in the respective region. The work function metal layer 108 can provide uniform threshold voltage (Vt) and drain voltage. The work function metal layer 108 may be deposited by CVD, PVD, ALD and/or other suitable process. In one example depicted herein, the work function metal layer 108 is formed using an ALD process.

The metal gate electrode 118 is formed over the work function metal layer 108 within openings defined in the ILD layer 260. The metal gate electrode 118 may be a single metal layer or multiple metal layers formed by CVD, PVD, plating, and/or other suitable processes. The metal gate electrode 118 may include Al, W, or Cu and/or other suitable materials. The metal gate electrode 118 may fill the remaining portion of the openings defined by the ILD layer 260.

An opening 114 (e.g., a line-cut) is formed in the metal gate structure 102 along with some portion of the ILD layer 260, dividing the metal gate structure 102 into a first sub-metal gate structure 102a and a second sub-metal gate structure 102b. The opening 114 is formed by removing a portion of the metal gate structure 102 of the device 100 to discontinue the longitudinal extension of the metal gate structure 102. The opening 114 is later filled with an isolation material to form an isolation region that isolates the electrical connection between the first and the second sub-metal gate structure 102a, 102b.

Figure 2:
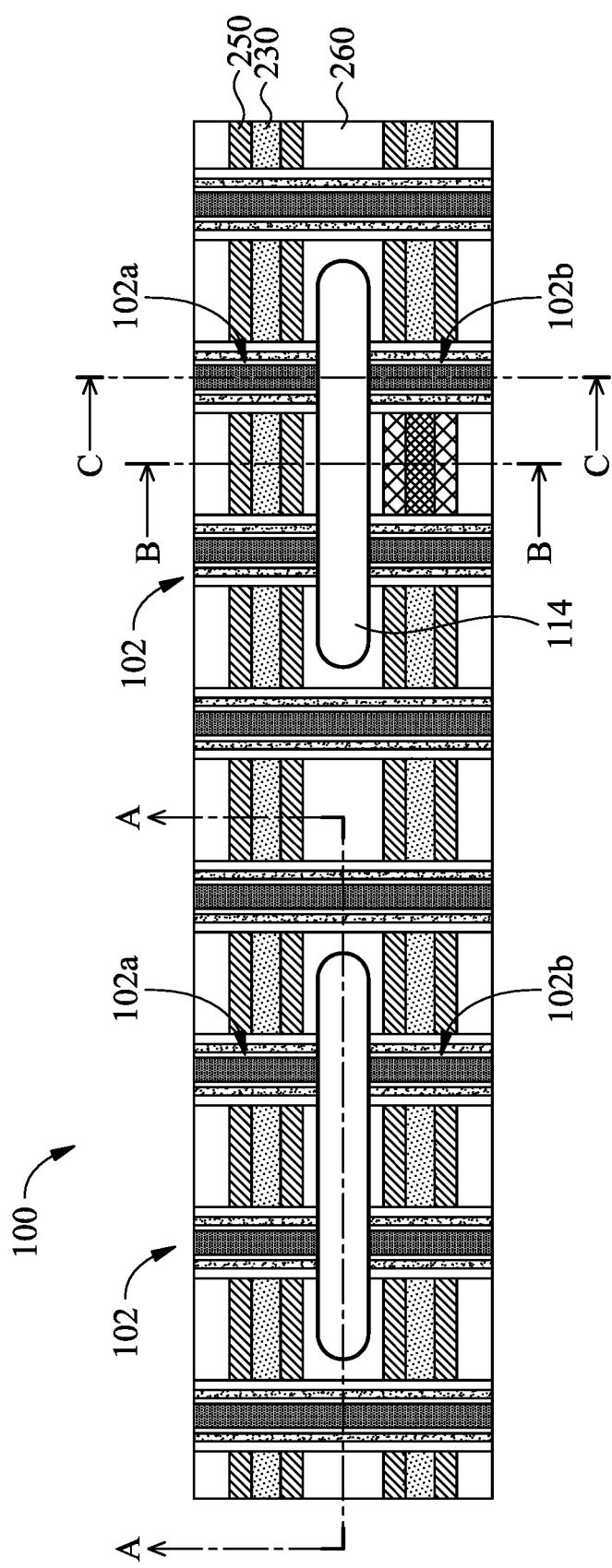
FIG. 2 depicts a top view of FinFET devices after a metal gate structure cutting process in accordance with some embodiments.
Figures 3A, 3B, 3C:
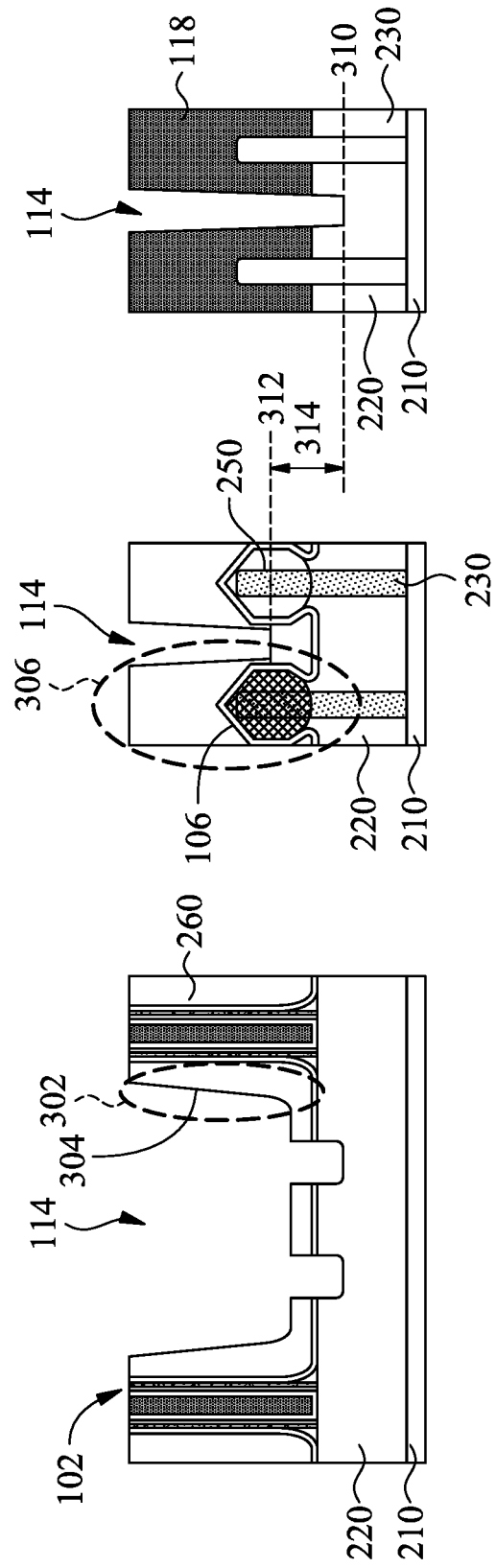
FIG. 3A-3C depicts cross sectional views of FinFET devices along the cutting lines A-A, B-B and C-C in FIG. 2, respectively, after a metal gate structure cutting process in accordance with some embodiments.

FIG. 2 depicts a top view of a portion of the semiconductor device structure 100 of FIG. 1. The opening 114 divides the metal gate structure 102 into the first and the second sub-metal gate structure 102a, 102b by etching a portion of the metal gate structure 102 and the ILD layer 260 away. FIGS. 3A, 3B, and 3C depict cross sectional views of the semiconductor device structure 100 along the cutting line A-A, B-B, and C-C respectively shown in FIGS. 1-2. It is noted that the sidewall spacer 104 and other layers, if any, is not shown in FIGS. 2 and 3A-3C for sake of clarity.

In some occasions, some metal residuals 304 may be left on the opening sidewalls on the ILD layer 260 after removing the metal gate structure 102 from the substrate 102, as indicated by the circle 302 depicted in FIG. 3A. In some occasions, aggressive etchants may laterally drift, adversely damaging the S/D features 250, as indicated by the circle 306 in FIG. 3B, resulting in loss of the structure of S/D features 250. Furthermore, etchants selected to etch the metal gate structure 102 as well as the ILD layer 260 may have inequivalent etching rates among these materials. Different etching rates at different locations of the semiconductor device structure 100 may result in different etching depths (shown by the dotted lines 312, 310 in FIGS. 3B and 3C respectively), creating a step height 314 at different locations of the opening 114. Thus, undesired under-etching profile may occur at some place while over-etching profile may occur at other places of the substrate.

Thus, some embodiments of the present disclosure provide a metal gate structure cutting process that may divide (e.g., cut or separate) the metal gate structures into sub-metal gate structures with desired profile control. The metal gate structure cutting process includes an ILD recess formation step as well as an ILD recess refilling step so as to form the opening in the ILD layer and the metal gate structure individually without adversely damaging the nearby structures.

Figure 4:
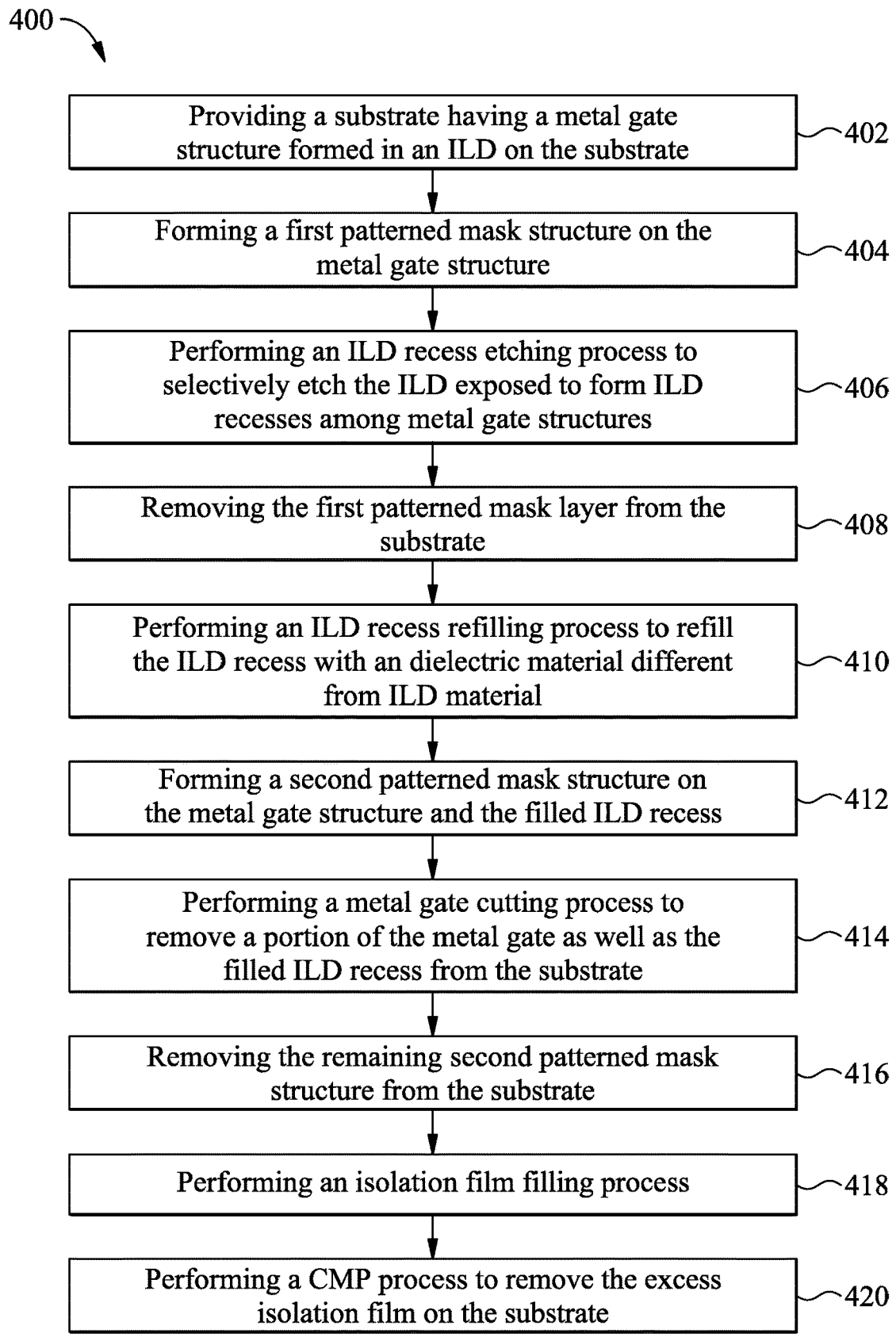
FIG. 4 is a flow chart of an exemplary process for performing a metal gate structure cutting process in accordance with some embodiments.
Figure 5:
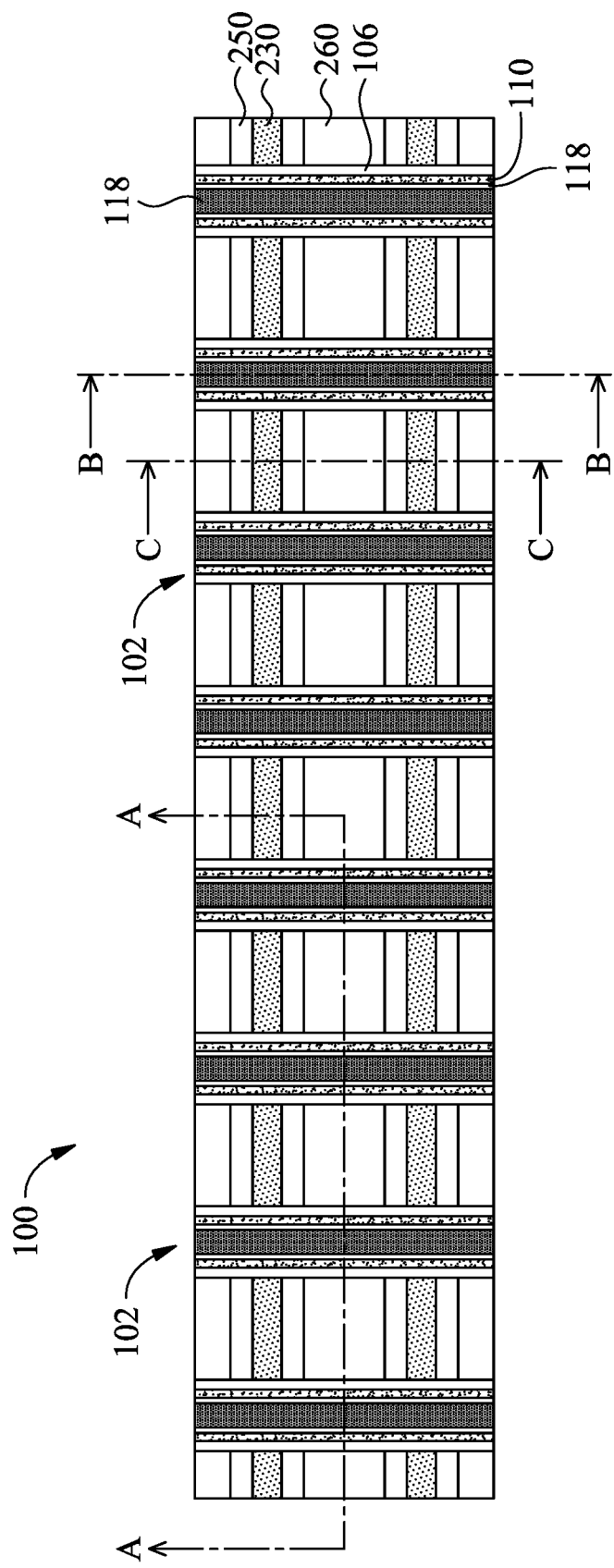
FIG. 5 depict a top view of a semiconductor device structure at certain manufacturing stages of FIG. 4 in accordance with some embodiments.

FIG. 4 depicts a flow diagram of a process 400 performed to cut metal gate structures in a semiconductor device structure, such as the semiconductor device structure 100 depicted in FIG. 5. FIGS. 5-14D are top views and cross-sectional views of a portion of the semiconductor device structure 100 corresponding to various stages of the process 400 in accordance with some embodiments. The example depicted in FIGS. 5-14D utilizing the process 400 is configured to form the semiconductor device structure 100 as previously discussed with reference to FIGS. 1-3C. However, it is noted that the process 400 may be utilized to form any suitable structures not presented herein.

The process 400 begins at operation 402 by providing the semiconductor device structure 100 having a plurality of gate structures 102 formed on the substrate 210, as shown in FIGS. 5-6C. FIG. 5 depicts a top view of the semiconductor device structure 100 while FIGS. 6A-6C depict cross sectional views of the semiconductor device structure 100 along the cutting lines A-A, B-B, and C-C as depicted in FIG. 5. The semiconductor device structure 100 has the metal gate structure 102 formed therein (e.g., after a dummy gate structures is removed and replaced with the metal gate structure 102), on which a metal gate cut process is to be performed to divide the metal gate structure into sub-metal gate structures.

Similarly, as described above, the metal gate structure 102 includes a gate dielectric layer 110, a work function metal layer 108, and a metal gate electrode 118. An etching stop layer 106 may be formed in the ILD layer 260. It is noted that the sidewall spacer 104 and other layers, if any, may not be shown in FIGS. 5 and 6A-6C to prevent obscuring other features illustrated therein. FIG. 6A depicts a cross-sectional view along the cutting line A-A of four metal gate structures 102 formed in the ILD layer 206. FIG. 6B depicts a cross-sectional view along the cutting line B-B having two fin structures 230 with the S/D features 250 formed atop of the fin structures 230 having the metal gate electrode 118 thereover. FIG. 6C depicts a cross-sectional view along the cutting line C-C of two fin structures 230 with the S/D features 250 formed atop of the fin structures 230 having the ILD layer 260 thereover.

At operation 404, a first patterned mask structure 702 is disposed on the semiconductor device structure 100 of the substrate 210, as shown in FIGS. 7A-7C. The first patterned mask structure 702 defines an opening 708 selectively exposing a portion of gate metal structures 102 and the ILD layer 260 to perform the metal gate structure cutting process. The first patterned mask structure 702 serves as a mask during an etching/patterning process so as to protect the structure covered by the patterned first mask structure 702 from being damaged during the etching/patterning process.

The first patterned mask structure 702 may include a photoresist 704 disposed on an anti-reflective coating (ARC) 706. The photoresist 704 may be patterned by a photolithography process to have a desired dimension that may be utilized as a mask to transfer features to the ILD layer 260. The first patterned mask structure 702 exposes the portion of the metal gate structures 102 and ILD layer 260 that is desired to be removed from the semiconductor device structure 100. Removal of certain portion of the metal gate structures 102 and the ILD layer 260 may discontinue the longitudinal extension of the gate metal structure 102, dividing (e.g., cutting) the gate metal structures 102 into sub-metal gate structures 102a, 102b.

In one example depicted in FIG. 7A, the opening 708 defined in the first patterned mask structure 702 has a sidewall 710 that defines a vertical plane passing through a portion of the ILD layer 260, defining a horizontal width 712 from the sidewall 711 of the ILD layer 260. The sidewall 711 of the ILD layer 260 is in contact with the etching stop layer 106 covered under the first patterned mask structure 702. The horizontal width 712, forming an edge portion 714, in the ILD layer 260 is covered under the first patterned mask structure 702 so as to protect the edge portion 714 of the ILD layer 260 from being etched away in the subsequent etching processes. In one example, the horizontal width 712 may have a width between about 5 nm and about 20 nm.

In one example, the opening 708 may have a first width 716 configured to expose at least two metal gate structures 102 and some portion of the ILD layer 260 defined therebetween, as shown in FIG. 7A. In contrast, in the cross sectional view depicted in FIG. 7C, a second width 718 of the opening 708 defined in the first patterned mask structure 702 is configured to expose an area of the ILD layer 260 defined between the S/D features 250 and fin structures 230.

Figures 8A, 8B, 8C:
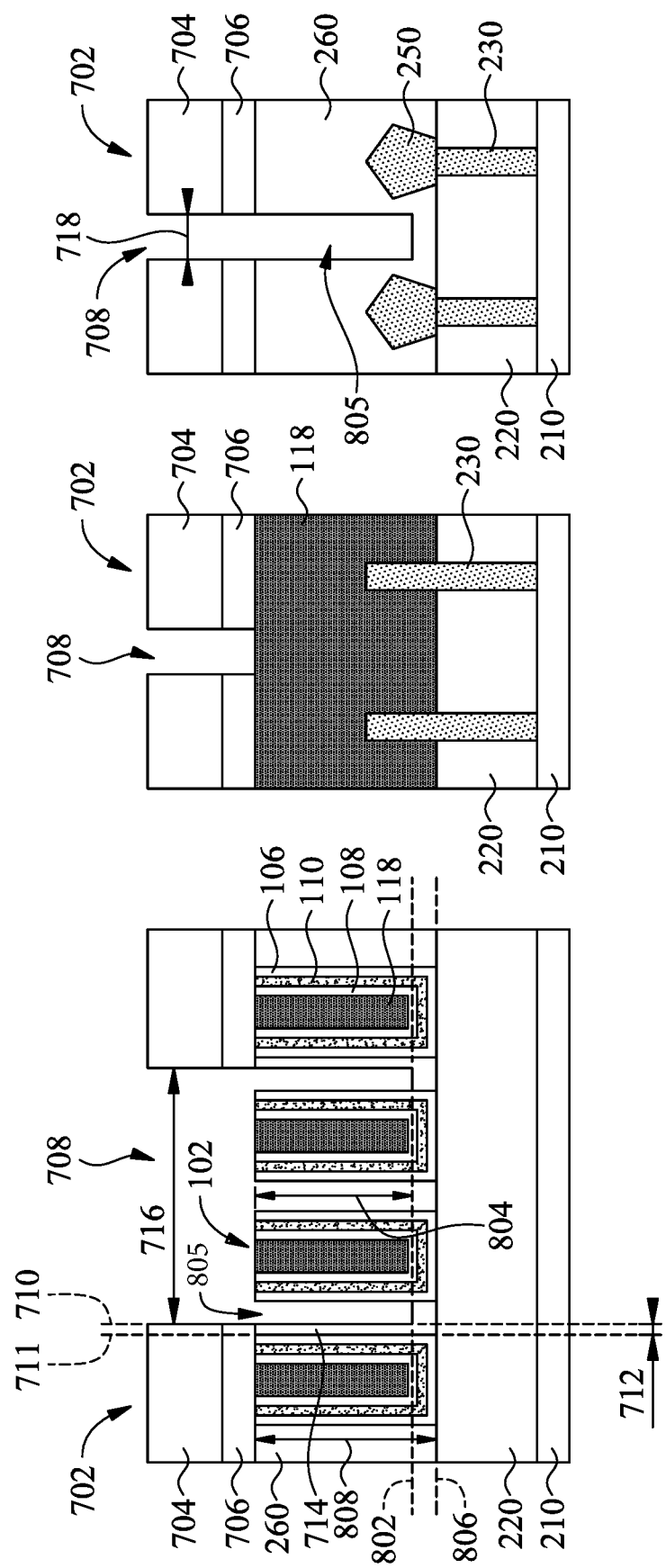
FIGS. 8A-8C depict cross sectional views of a semiconductor device structure at certain manufacturing stages of FIG. 4 in accordance with some embodiments.

At operation 406, an ILD recess etching process is performed to remove the ILD layer 260 exposed through the openings 708 defined by the first patterned mask structure 702, as shown in FIGS. 8A-8C. The opening 708 of the first patterned mask structure 702 allows the etchants from the ILD recess etching process to pass therethrough to react with the ILD layer 260 so as to remove the exposed ILD layer 260, as shown in FIGS. 8A and 8C. The ILD recess etching process is a selective etching process that provides etchants that may selectively etch the ILD layer 260 without damaging or attacking the metal gate structure 102 exposed on the substrate 210, as shown in FIGS. 8A and 8B. Thus, the metal gate structure 102 remains intact, as shown in FIG. 8B, during the ILD recess etching process. By doing so, the metal gate structure 102 and the ILD layer 260 may be separately and individually etched at different processing stages. As a result, relatively gentle and/or mild etchants may be utilized to etch certain material at a certain manufacturing stage, rather than using aggressive etchants to etch all materials (including the ILD layer and multiple materials in the metal gate structure) simultaneously.

Thus, by selectively etching the ILD layer 260 prior to removing the metal gate structure 102 from the substrate 210 (e.g., individually etching the ILD layer 260 and the metal gate structure 102 at different manufacturing stages), a good interface and etching profile management may be obtained.

In one example, the ILD recess etching process selectively etches the ILD layer 260 to form a recess 805 in the ILD layer 260 having a predetermined depth 804 (as shown by the dotted line 802), as shown in FIG. 8A. The predetermined depth 804 of the recess 805 may be shorter than a depth 808 of the metal gate structure 102 (as shown by the dotted line 806). In one example, the predetermined depth 804 of recess 805 may be between about 5% and about 30% shorter than the depth 808 of the metal gate structure 102. As the etchants at the ILD recess etching process selectively etches the ILD layer 260, the metal gate electrode 118 exposed by the first patterned mask structure 702 remains un-etched or un-damaged on the substrate 210, as shown in FIGS. 8A and 8B.

Figures 9A, 9B, 9C:
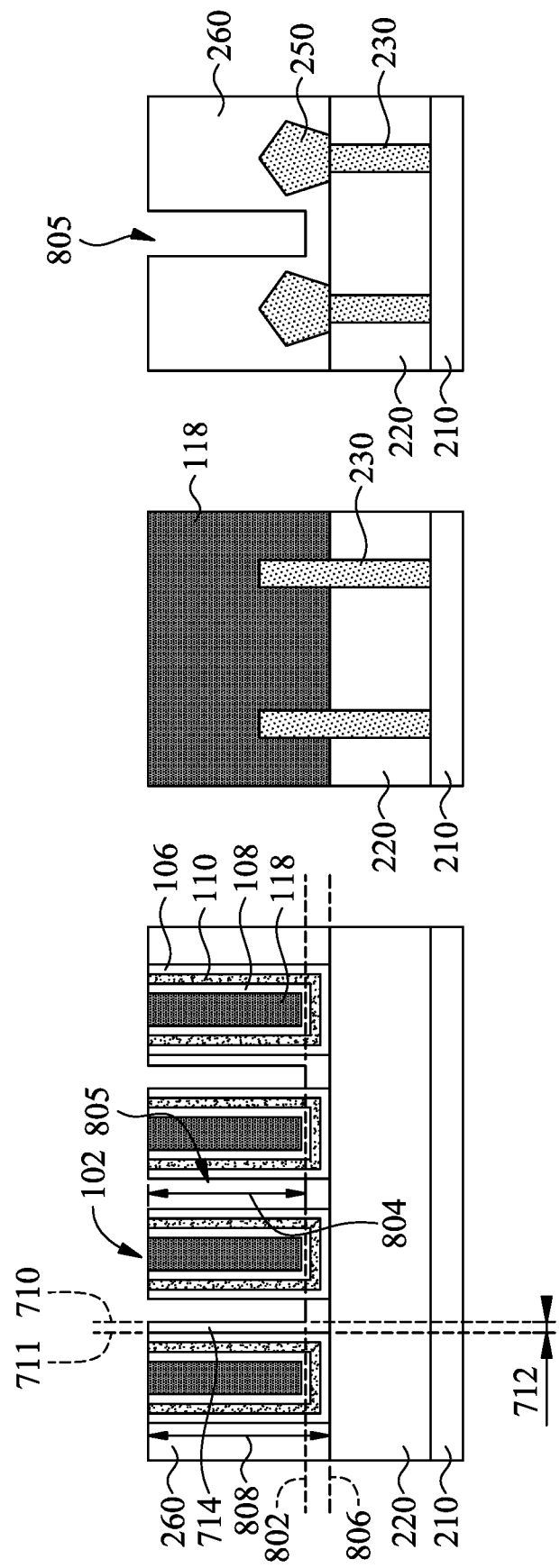
FIGS. 9A-9C depict cross sectional views of a semiconductor device structure at certain manufacturing stages of FIG. 4 in accordance with some embodiments.

At operation 408, after the recess 805 is defined in the ILD layer 260, the first patterned mask structure 702 is then removed from the substrate 210, as shown in FIGS. 9A-9C. The first patterned mask structure 702 may be removed by any suitable process, including etching, stripping, and ashing processes and the like. The edge portion 714 of the ILD layer 260 interfaced with the recess 805 remains on the substrate 210 to serve as liner protection during the subsequent manufacturing process.

Figures 10A, 10B, 10C:
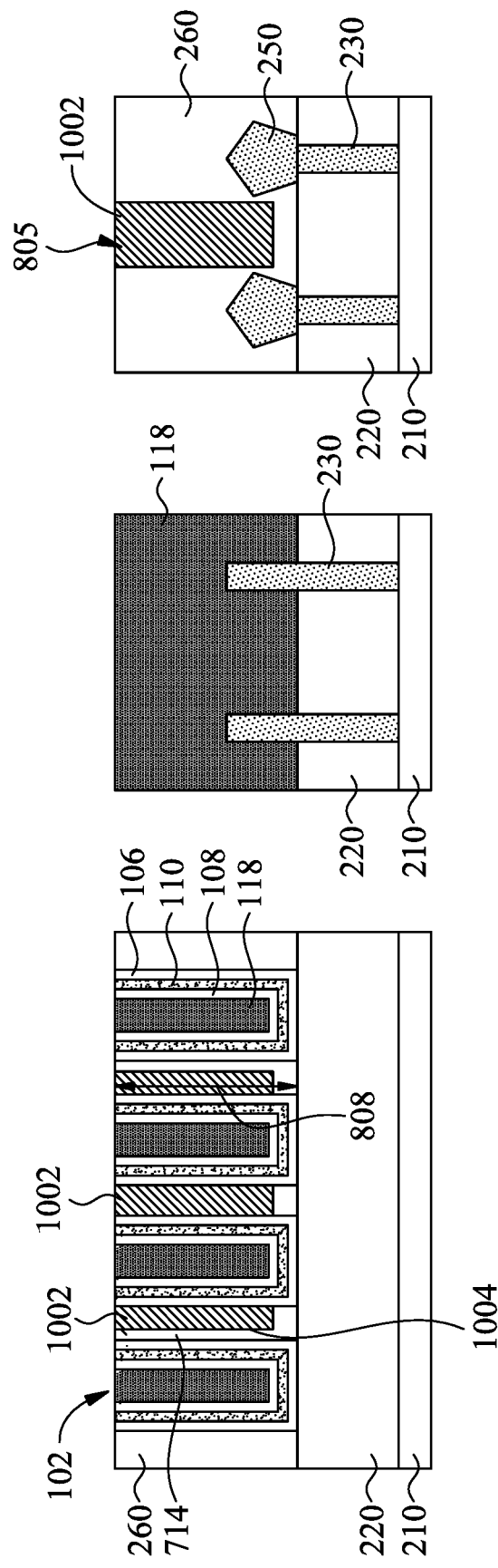
FIGS. 10A-10C depict cross sectional views of a semiconductor device structure at certain manufacturing stages of FIG. 4 in accordance with some embodiments.

At operation 410, after the first patterned mask structure 702 is removed, an ILD recess refilling process is performed. The ILD recess refilling process forms a dielectric structure 1002 fabricated from a material different from the material selected to fabricate the ILD layer 260 in the recess 805 defined in the ILD layer 260, as shown in FIGS. 10A-10C. It is noted that the dielectric structure 1002 may be first formed as a blanket layer covering the surface of the substrate 210 and followed by a CMP process to polish away the excess material of the dielectric structure 1002 from the recess 805. Thus, the dielectric structure 1002 is formed and filled in the recess 805 having a top surface substantially coplanar with the top surfaces of the metal gate structure 102 and the ILD layer 260. The dielectric structure 1002 formed between the metal gate structures 102 having a sidewall 1004 interfaced with the edge portion 714 of the ILD layer 260 defined by the ILD recess etching process at operation 406. In one example, the dielectric structure 1002 may be deposited by CVD, atomic layer deposition (ALD), spin-on coating, or other suitable techniques. The dielectric structure 1002 may include silicon oxide, silicon nitride, oxynitride, a dielectric material having a dielectric constant (k) lower than silicon oxide (therefore referred to as low-k dielectric material layer), and/or other suitable dielectric material layer.

As the dielectric structure 1002 is formed by a material different from the material utilized to form the ILD layer 260, a selective etching process may also be performed to selectively etch the dielectric structure 1002, ILD layer 260 or even the metal gate structure 102 individually with high selectivity (e.g., the metal gate structure 102 formed by a metal containing material different from the dielectric materials selected to fabricate the dielectric structure 1002 and the ILD layer 260). In one example, the dielectric structure 1002 may be fabricated from $SiO_2$, SiOC, SiC, SiON, SiN, amorphous carbon, boron doped nitride, boron doped silicon containing materials, boron doped carbide materials, or a low-k material.

Figures 11A, 11B, 11C:
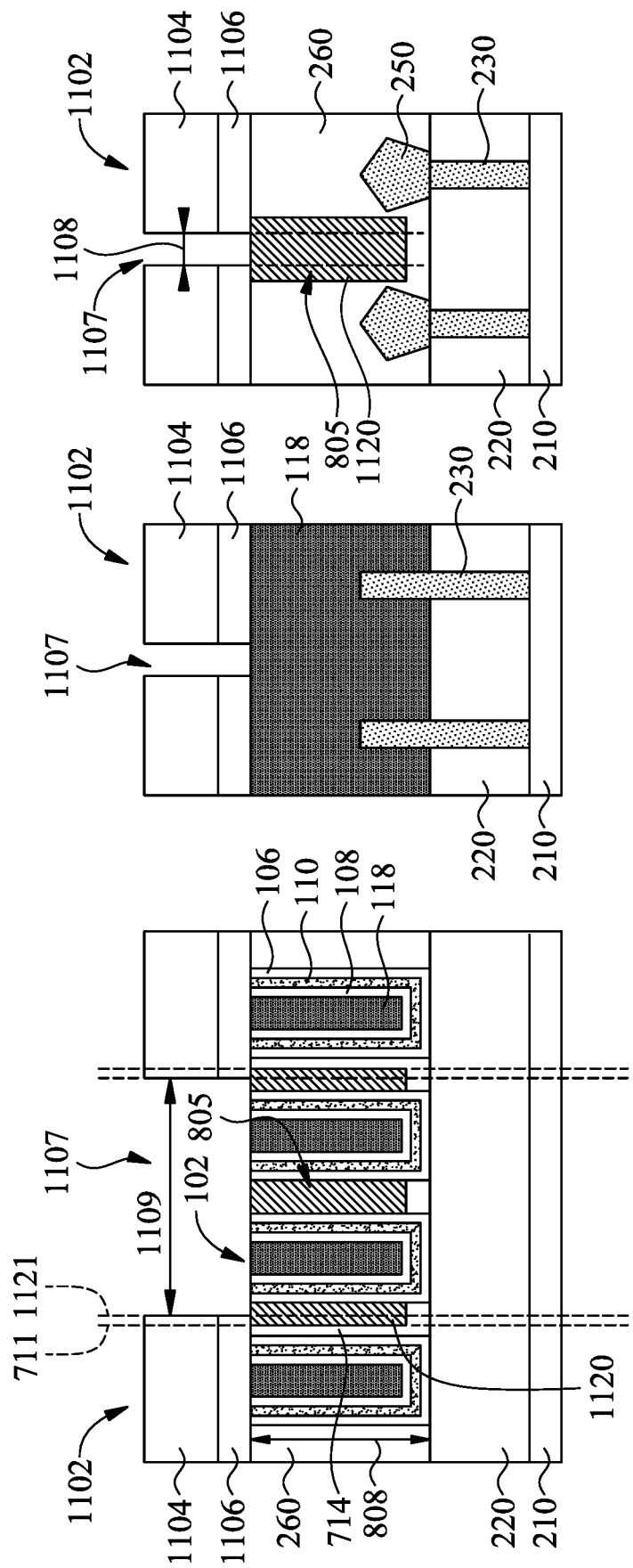
FIGS. 11A-11C depict cross sectional views of a semiconductor device structure at certain manufacturing stages of FIG. 4 in accordance with some embodiments.

At operation 412, after the dielectric structure 1002 is formed in the recess 805, a second patterned mask structure 1102 may be formed on the semiconductor device structure 100, defining an opening 1107 on the substrate surface, as shown in FIGS. 11A-11C. The second patterned mask structure 1102 may be similar to the first patterned mask structure 702 described above. The second patterned mask structure 1102 defines the opening 1107 exposing a portion of gate metal structures 102 and the ILD layer 260 to perform the metal gate structure cutting process.

The opening 1107 defined by the second patterned mask structure 1102 may have a first width 1109 smaller than the first width 716 of the opening 708 defined by the first patterned mask structure 702 and similarly a second width 1108 smaller than the second width 718 of the opening 708 defined by the first patterned mask structure 702. The second patterned mask structure 1102 is utilized to further define the range of the metal gate structure 102 and the portion of the dielectric structure 1002 to be removed and/or cut from the substrate 210. The smaller first and second widths 1109, 1108 defined by the opening 1107 of the second patterned mask structure 1102 allows an edge portion 1120 of the dielectric structure 1002 to remain during the subsequent metal gate structure cutting process. The edge portion 1120 of the dielectric structure 1002 remaining on the substrate (along with the edge portion 714 of the ILD layer 260) may serve as a liner protection during the metal gate structure cutting process.

Similar to the first patterned mask structure 702, the second patterned mask structure 1102 includes a photoresist 1104 disposed on an anti-reflective coating (ARC) 1106. In one example depicted in FIG. 11A-11C, the opening 1107 defined in the second patterned mask structure 1102 has a sidewall 1121 that defines a vertical plane passing through a portion of the dielectric structure 1002, defining the edge portion 1120 of the dielectric structure 1002. The edge portion 1120 is covered under the second patterned mask structure 1102 so as to avoid being etched away or damaged during the subsequent etching processes. In one example, the edge portion 1120 may have a width between about 5 nm and about 20 nm.

The second patterned mask structure 1102 also defines the opening 1107 above the metal gate electrode 118, as shown in FIG. 11B, to expose the metal gate electrode 118 to be etched/cut away.

Figures 12A, 12B, 12C:
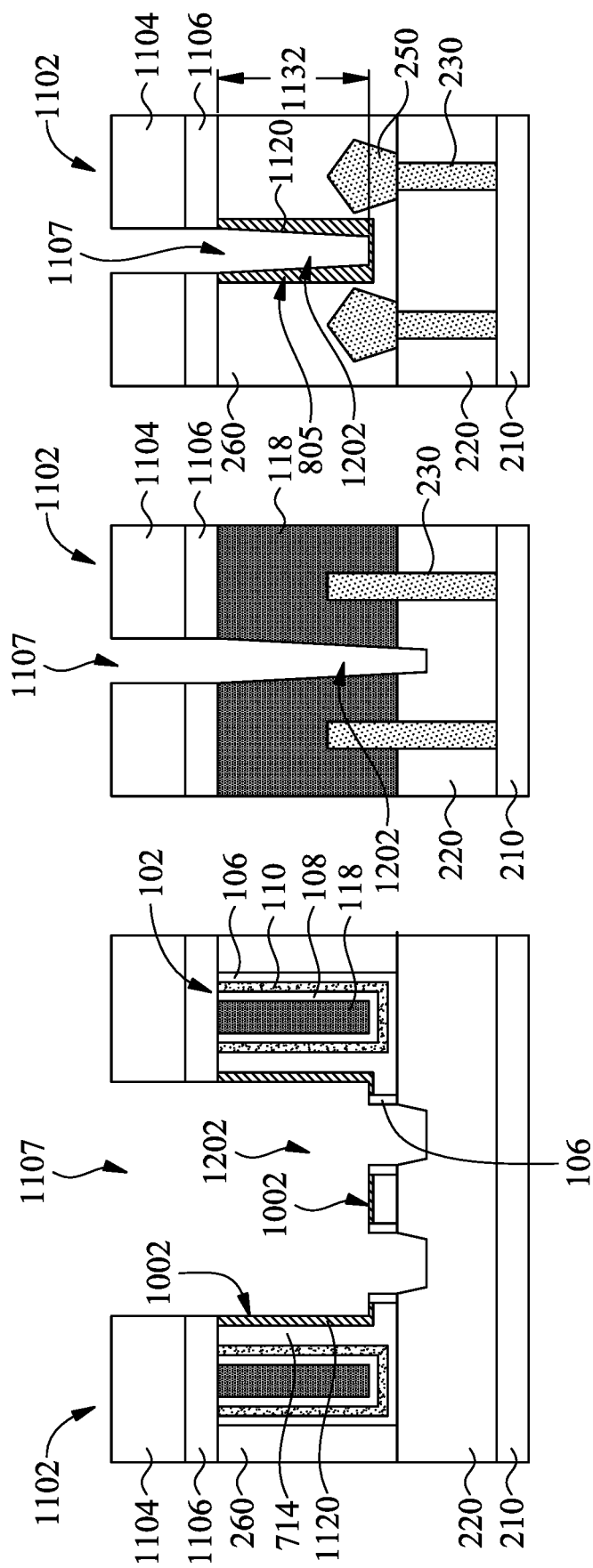
FIGS. 12A-12C and 12A'-12C' depict cross sectional views of a semiconductor device structure at certain manufacturing stages of FIG. 4 in accordance with some embodiments.
Figures 12A, 12B, 12C:
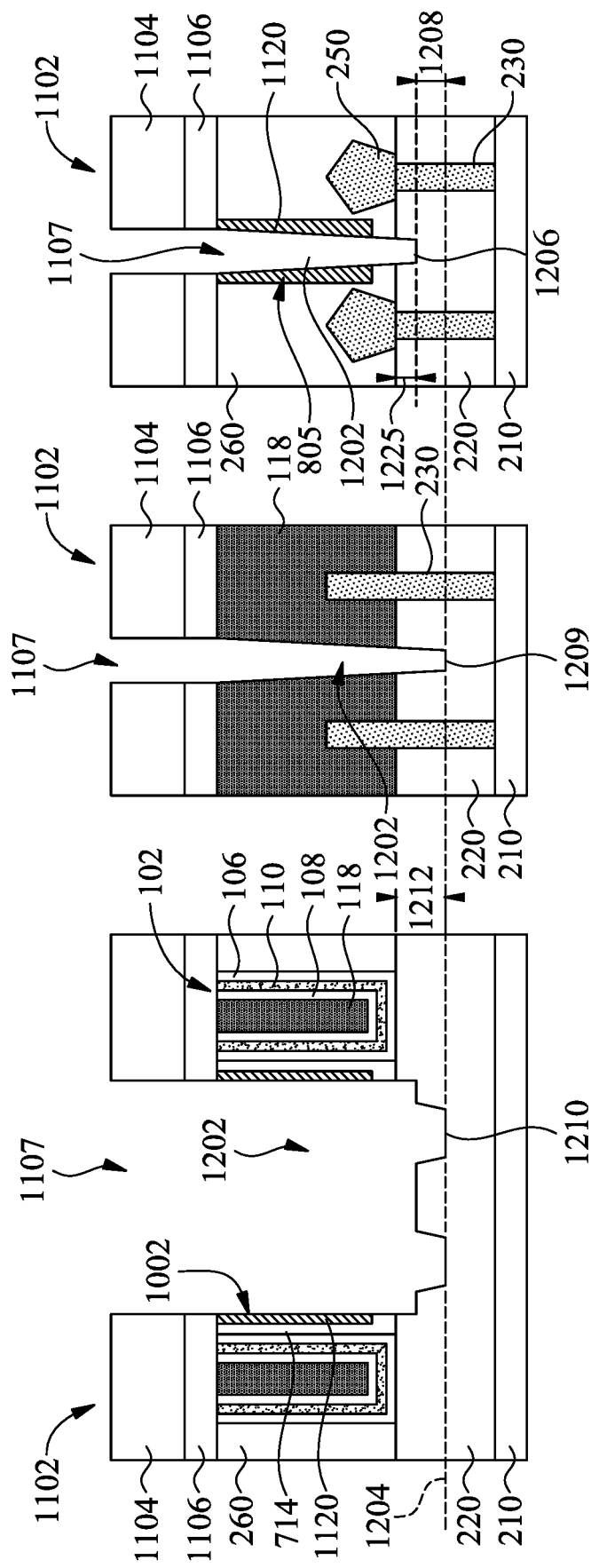

At operation 414, a metal gate structure cutting process is performed to remove the structures exposed by the second patterned mask structure 1102, as shown in a first example of FIGS. 12A-12C or in a second example of FIGS. 12A'-12C'. The metal gate structure cutting process is performed by supplying an etching gas mixture to remove the materials in the substrate 210 exposed by the second patterned mask structure 1102 until the exposed metal gate structures 102 are removed. Removal of the metal gate structures 102 along with some dielectric structure 1002 exposed by the second patterned mask structure 1102 creates an opening 1202 (e.g., a line cut), as shown in FIGS. 12A-12C and 12A'-12C', in the ILD layer 260 and other metal gate structures 102.

During the metal gate structure cutting process, the etchants as selected are relatively aggressive so as to remove or etch both the metal containing materials from the metal gate structure 102 as well as the dielectric materials from the dielectric structure 1002 from the substrate. Thus, the gate metal electrode 118 is also removed until a desired depth of the gate metal electrode 118 is etched through, as shown in FIG. 12B. A portion of the dielectric structure 1002 exposed by the second patterned mask structure 1102 is also removed, forming the opening 1202, as shown in FIG. 12C.

As the metal containing materials from the metal gate structure 102 have different film properties from the dielectric materials from the dielectric structure 1002, different etching rates may occur when etching different types of the materials on the substrate 210. For example, when the etchants from the metal gate structure cutting process have a faster etching rate to etch the metal containing materials, the gate metal electrode 118 may be etched at a faster rate than the dielectric structure 1002. The faster etching rate to the gate metal electrode 118 may result in the openings 1202 formed therein having a depth 1130, as shown in FIG. 12B, longer than a depth 1132 of the opening 1202, as shown in FIG. 12C, formed in the dielectric structure 1002.

In some examples, the etchants selected during the metal gate structure cutting process may have a high selectivity among the metal materials from the metal gate structure 102, the etching stop layer 106, and the dielectric structure 1002. As a result, the etchants from the metal gate structure cutting process may predominately etch the metal gate structure 102, or even further down to a portion of the isolation features 220, as shown in FIG. 12A, leaving a portion of the etching stop layer 106 and the dielectric structure 1002 in the opening 1202.

In another example, the etchants selected during metal gate structure cutting process may be relatively aggressive having a relatively low selectivity among the materials from the metal gate structure 102, the etching stop layer 106, and the dielectric structure 1002. As a result, the etchants from the metal gate structure cutting process may globally etch the metal gate structure 102, the etching stop layer 106, and the dielectric structure 1002 uncovered by the second patterned mask structure 1102. In this example, the etchants may continue etching until desired depths 1212, 1225 of the isolation features 220 are etched away, exposing bottom surfaces 1210, 1209, 1206 in the opening 1202 at different locations of the semiconductor device structure 100, as shown in FIGS. 12A', 12B' and 12C' respectively. The global etching from the metal gate structure cutting process may remove substantially all of the gate metal structure 102, the etching stop layer 106, and the dielectric structure 1002 uncovered by the second patterned mask structure 1102 away in the opening 1202, as shown in FIG. 12A'. As discussed above, as different etching rates may occur at different materials from the substrate (e.g., metal containing material compared to dielectric materials), the faster etching rate for etching the gate metal electrode 118 may result in the openings 1202 formed therein having the longer depth 1212 into the isolation features 220, as shown in FIG. 12B', longer than the depth 1225 formed through the dielectric structure 1002, as shown in FIG. 12C'. In one example, the depth 1212 formed in the isolation feature 220 extending through the gate metal electrode 118, as shown in FIG. 12B', is about 5% to about 30% greater than the depth 1225 formed in the isolation feature 220 extending through the ILD layer 260, as shown in FIG. 12C'.

Figures 13A, 13B, 13C:
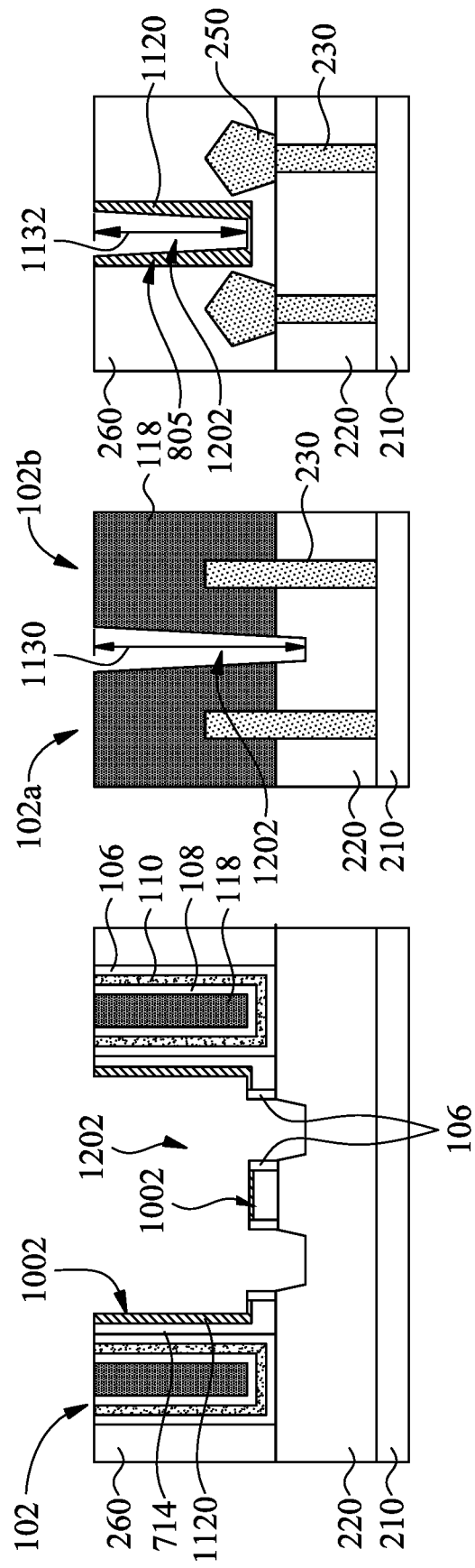
FIGS. 13A-13C and 13A'-13C' depict cross sectional views of a semiconductor device structure at certain manufacturing stages of FIG. 4 in accordance with some embodiments.

At operation 416, after portions of the metal gate structures 102 and ILD layer 260 are removed, the second patterned hardmask structure 1102 may then be removed, as shown in FIGS. 13A-13C and 13A'-13C'. In the first example depicted in FIGS. 13A-13C, the opening 1202 has the edge portion 1120 of the dielectric structure 1002 lining on the edge portion 714 of the ILD layer 260, forming a protection structure around the perimeter of the opening 1202. The opening 1202 divides and discontinues the longitudinal length of the metal gate structures 102, forming sub-metal gate structures 102a, 102b as needed for different device performance requirements. The openings 1202 as shown in FIG. 13A may have some residual etch stop layer 106 and the dielectric structure 1002 remaining between areas where the metal gate structures 102 were removed due to the etching rate difference when etching a metal containing material and a dielectric material. Furthermore, the depth 1130 of the opening 1202 formed in the metal gate electrode 118, as shown in FIG. 13B, may be longer than the depth 1132 of the opening 1202 formed in the ILD layer 260 having the remaining dielectric structure 1002 surrounded the opening 1202, as shown in FIG. 13C.

Similarly, in the example depicted in FIGS. 13A'-13C', the opening 1202 has the bottom surface 1210 of the isolation feature 220 exposed, as shown in FIG. 13A', without the residual etching stop layer 106 and the dielectric structure 1002 remaining. The opening 1202 has the edge portion 1120 of the dielectric structure 1002 lining on the edge portion 714 of the ILD layer 260, forming a protection structure around the opening 1202. In this example, the opening 1202 formed in the ILD layer 260 as shown in FIG. 13C' extends further down to the isolation feature 220 having the depth 1225 formed therein slightly shorter than the depth 1212 of the opening 1202 formed in the metal gate electrode 118 as shown in FIG. 13b'.

Figures 14A, 14B, 14C:
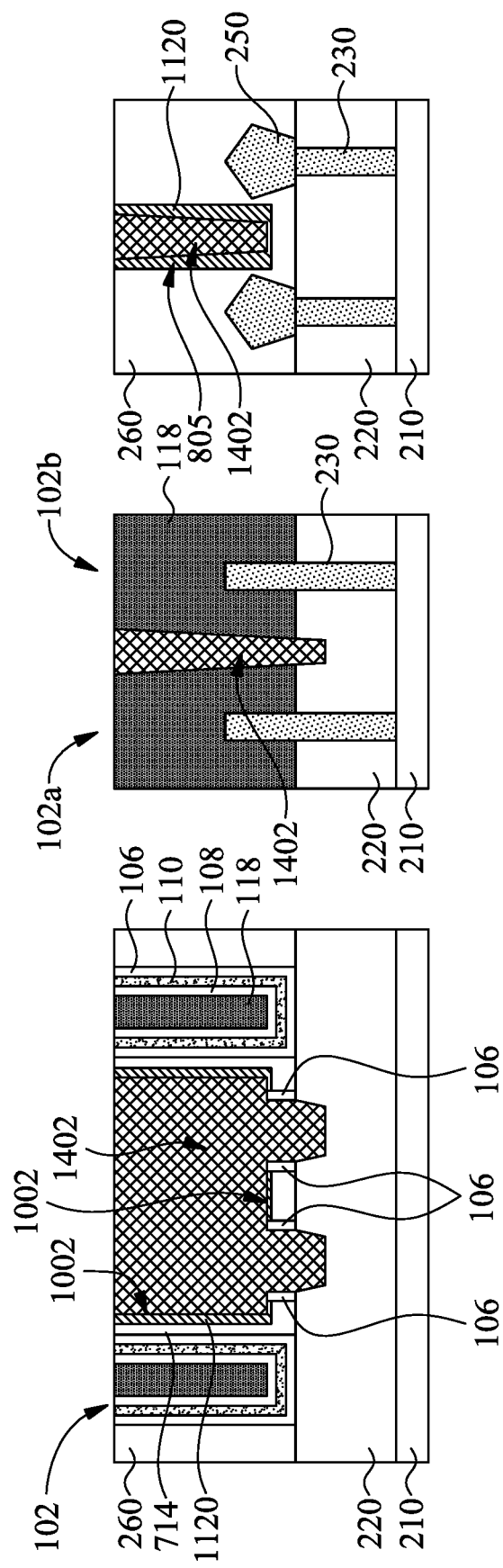
FIGS. 14A-14C and 14A'-14C' depict cross sectional views of a semiconductor device structure at certain manufacturing stages of FIG. 4 in accordance with some embodiments.
Figures 14A, 14B, 14C:
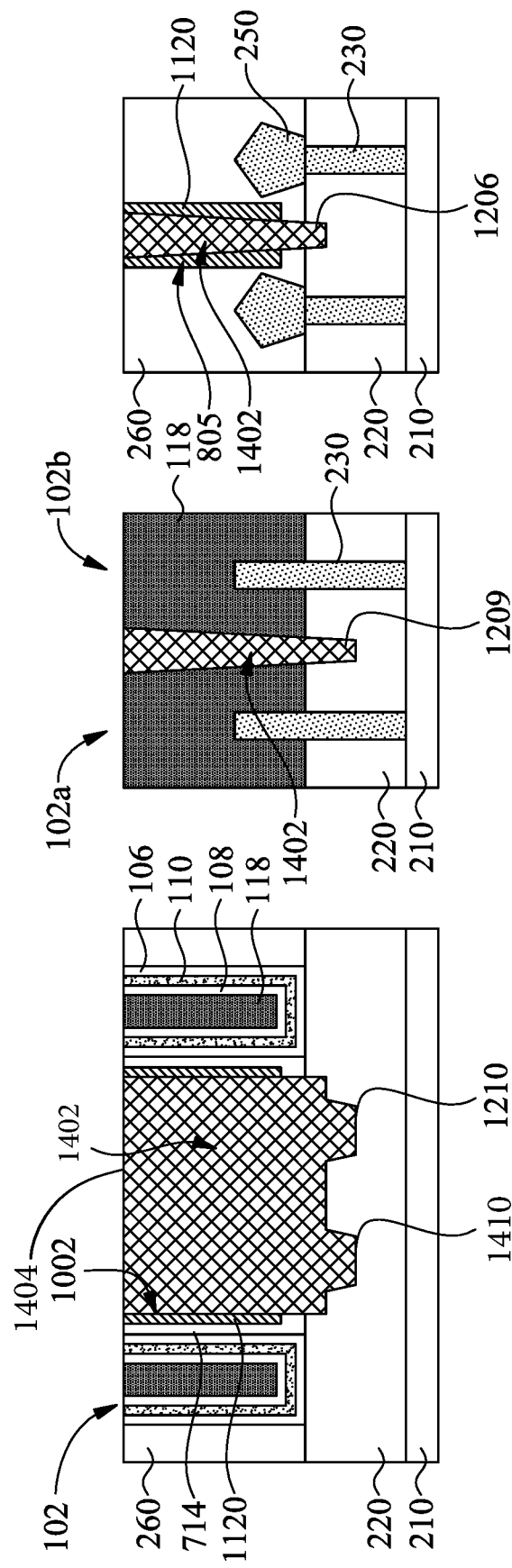

At operation 418, after the second patterned mask layer 1102 is removed, an isolation structure 1402 is filled by a dielectric material in the openings 1202, as shown in FIGS. 14A-14C and 14A'-14C'. As discussed above, after the metal gate structure cutting process, the openings 1202 are formed in the semiconductor device structure 100 to divide and/or discontinue the metal gate structure 102, forming the sub-metal gate structures 102a, 102b. The isolation structure 1402 is then formed and fills the openings 1202 formed between the sub-metal gate structures 102a, 102b to insulate the electric conductivity between the sub-metal gate structures 102a, 102b. As discussed above, the isolation structure 1402 filled in the openings 1202 may have different depths at different locations based on the depths 1132, 1212, 1225 defined by the opening 1102. In one example, the isolation structure 1402 has a bottom surface 1410 with step heights to mate with the bottom surfaces 1210, 1209, 1206 defined the opening 1202. The step heights formed in the bottom surface 1410 of the isolation structure 1402 creates a varying depth (e.g., from a top surface 1404 to the bottom surface 1410 of the isolation structure 1402) across the body of the isolation structure 1402.

The isolation structure 1402 is formed from a material different from the material used to fabricate the dielectric structure 1002 and the ILD layer 260, in some examples. Thus, a dual layer structure, including the edge portions 1120 from the dielectric structure 1002 and the isolation structure 1402, as well as the edge portion 714 from the ILD layer 260 may be obtained to protect the structure of the metal gate structures 102 and the ILD layers remaining on the substrate. Thus, the opening 1202 (e.g., the line-cut) includes the dielectric structure 1002 circumscribing the isolation structure 1402, forming a dual layer structure. The dual layer structure formed in the opening 1202 may protect and provide the sidewalls of the areas interfaced with the openings 1202 with good protection and interface management.

The dielectric material used to fill the openings 1202 to form the isolation structure 1402 includes $SiO_2$, SiON, SiN, SiC, SiOC, SiOCN, or low-k materials as needed. After the isolation structure 1402 is formed, a CMP process may be performed to polish back the excess dielectric materials utilized to form the isolation structure 1402 and provide a substantially planar top surface of the isolation structure 1402 relative to the top surface of the metal gate structure 102.

Figure 14D:
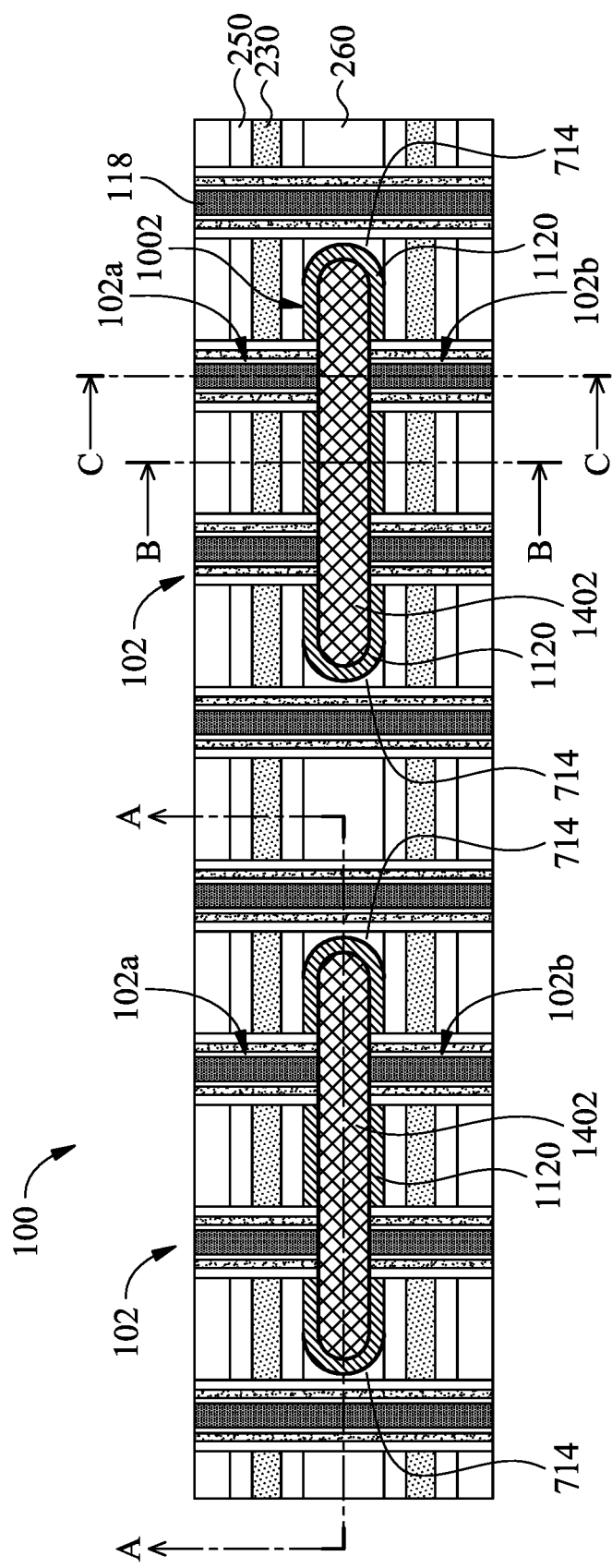
FIG. 14D depicts a top view of a semiconductor device structure at certain manufacturing stages of FIG. 4 in accordance with some embodiments.

FIG. 14D depicts the top view of the semiconductor device structure 100 having the isolation structure 1402 filled in between the sub-metal gate structures 102a, 102b. The dual layer structure is also formed from the isolation structure 1402 and the edge portion 1120 from the dielectric structure 1002 (e.g., may also include the edge portion 714 from the ILD 260) disposed between the sub-metal gate structures 102a, 102b. By utilizing the dual layer structure, a good interface management and isolation property may be obtained between sub-metal gate structures 102a, 102b. Furthermore, the two step etching process (e.g., ILD recess etching and metal gate structure cutting process) may individually etch the metal materials and the insulating materials at different manufacturing stages, so that specific types of the etchants may be carefully selected as needed to enable successful etching process without undesired residuals and poor profile management.

Figure 15:
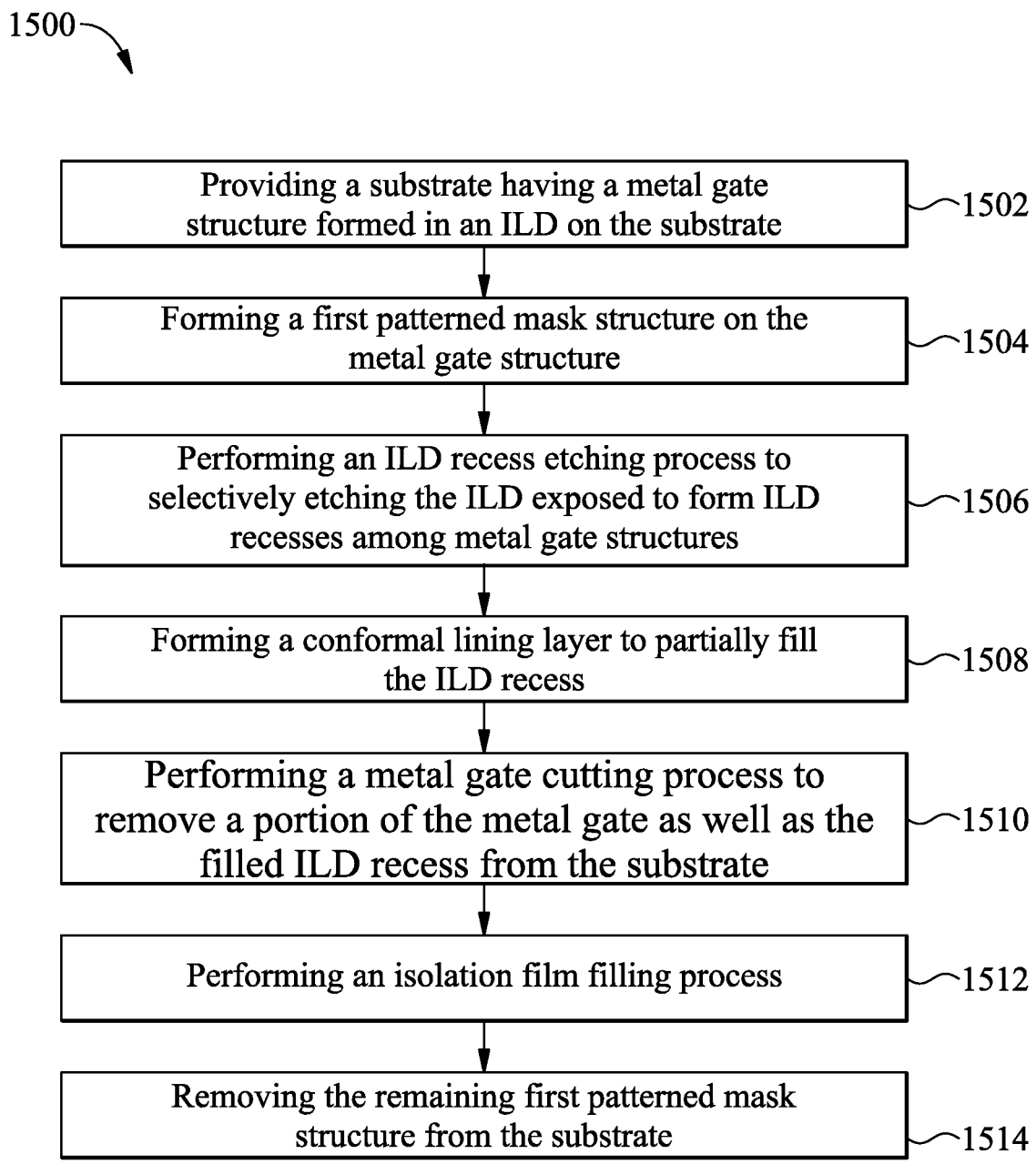
FIG. 15 is a flow chart of an another exemplary process for performing a metal gate structure cutting process in accordance with some embodiments.

FIG. 15 depicts a flow diagram of another embodiment of a process 1500 performed to cut metal gate structures in a semiconductor device structure, such as the semiconductor device structure 100 depicted in FIG. 5. Similar to the process 400 discussed above, operations 1502, 1504 and 1506 are similar to the operations 402, 404, 406 with referenced to FIGS. 5-8C discussed above. After operation 1506, the recess 805 is formed in the ILD 260 exposed by the first pattered mask structure 702, as shown in FIG. 8A-8C.

Figures 16A, 16B, 16C:
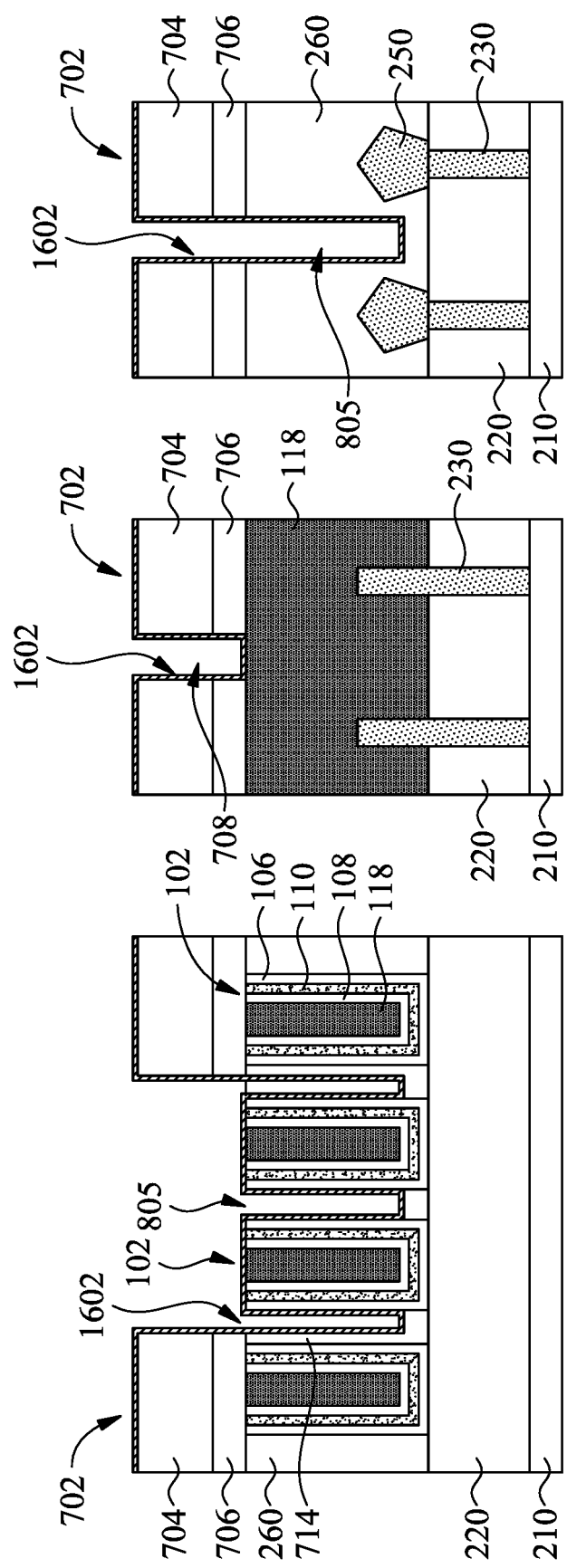
FIGS. 16A-16C depict cross sectional views of a semiconductor device structure at certain manufacturing stages of FIG. 15 in accordance with some embodiments.

At operation 1508, a conformal liner layer 1602 is then conformally formed in the recess 805 lining on sidewalls of the edge portion 714 of the ILD layer 260 and the etching stop layer 106, as shown in FIG. 16A along the cutting line A-A of FIG. 5. The conformal liner layer 1602, which is also a dielectric structure, is formed on the substrate following the topography of the substrate surface. Thus, in the area wherein the gate metal electrode 118 is exposed by the first patterned mask structure 702 along the cutting line B-B, as shown in FIG. 16B, the conformal liner layer 1602 is then formed on the exposed surface of the gate metal electrode 118. Similarly, in the area wherein the ILD layer 260 is exposed by the recess 805 and opening through the first patterned mask structure 702 along the cutting line C-C, as shown in FIG. 16C, the conformal liner layer 1602 is formed in contact with and lining on the ILD layer 260.

Figures 17A, 17B, 17C:
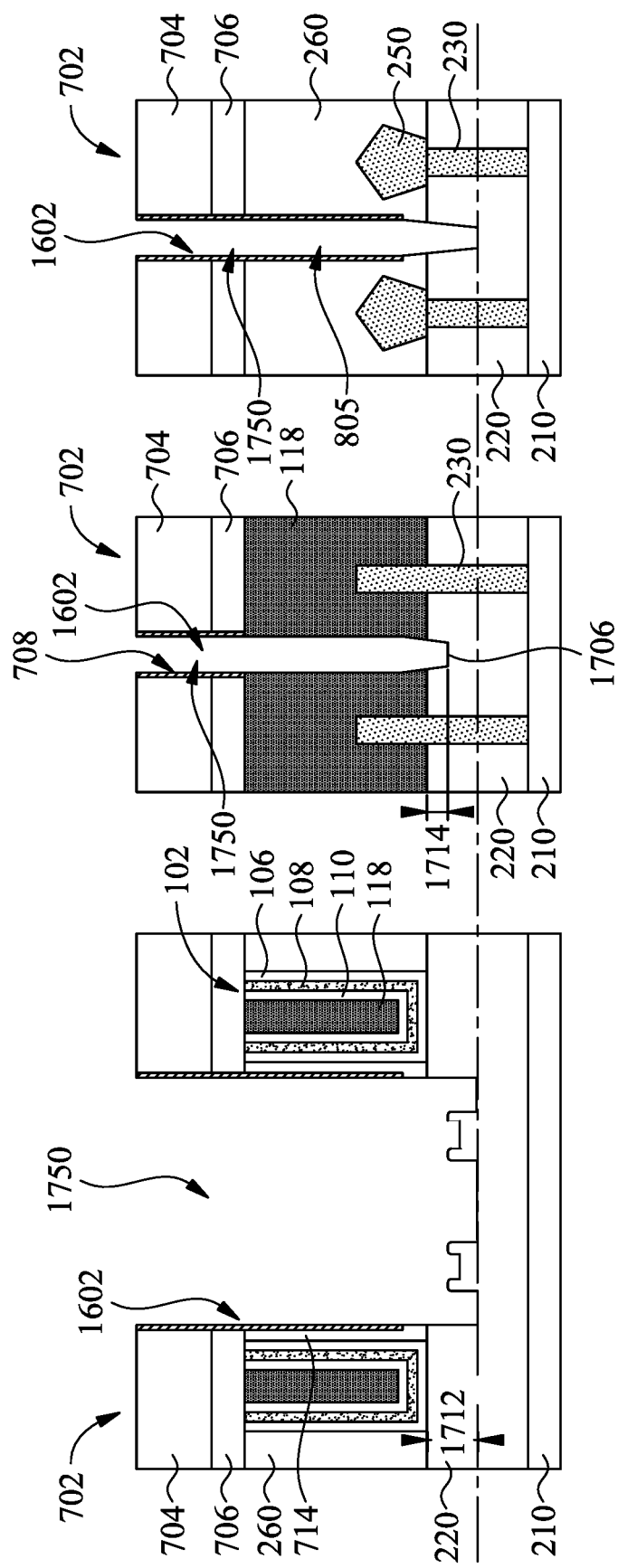
FIGS. 17A-17C depict cross sectional views of a semiconductor device structure at certain manufacturing stages of FIG. 15 in accordance with some embodiments.

At operation 1510, a metal gate structure cutting process, similar to the operation 414 in process 400, is performed to remove the gate metal structures 102 exposed by the first patterned mask structure 702, as shown in FIGS. 17A-17C, forming an opening 1750 (e.g., a line cut) therein surrounded by the conformal liner layer 1602. In this example, the etchants supplied to etch the metal gate structure 102 are relatively aggressive so as to etch the metal gate structures 102 as well as the ILD layer 260 exposed by the first patterned mask structure 702 away from the substrate. The metal gate structure cutting process is continuously performed until a desired depth 1712 of the isolation feature 220 is also removed from the substrate 210, as shown in FIGS. 17A and 17C, exposing a bottom surface 1708. However, in the area wherein the etchants predominately etches the gate metal electrode 118, as shown in FIG. 17B, the etchants may continue etching down to the isolation feature 220 to a desired depth 1714 shorter than the depth 1712. In one example, the depth 1714 formed at the area, as shown in FIG. 17B (along the cutting line B-B in FIG. 5) is removed is about 5% and about 30% shorter than the depth 1712, as shown in FIGS. 17A and 17C (along the cutting line A-A and C-C in FIG. 5 respectively).

At operation 1512, after the metal gate structures 102 along with some ILD layer 260 and the metal gate electrode 118 are removed from the substrate 210, an isolation structure 1802 is filled by a dielectric material in the openings 1750, as shown in FIGS. 18A-18C. As discussed above in operation 418 in the process 400, after the gate metal structure cutting process, the openings 1750 are formed in the semiconductor device structure 100 to divide and/or discontinue the metal gate structure 102, forming the sub-metal gate structures 102a, 102b. The isolation structure 1802 is then formed and filled in the openings 1750 formed between the sub-metal gate structures 102a, 102b to insulate the electric conductivity between the sub-metal gate structures 102a, 102b. The isolation structure 1802 is similar to the isolation structure 1402 discussed above. The isolation structure 1802 is fabricated from a material different from the ILD layer 260 and the conformal liner layer 1602. The dielectric material used to fill the openings 1750 to form the isolation structure 1802 includes $SiO_2$, SiON, SiN, SiC, SiOC, SiOCN, or low-k materials as needed.

Figures 19A, 19B, 19C:
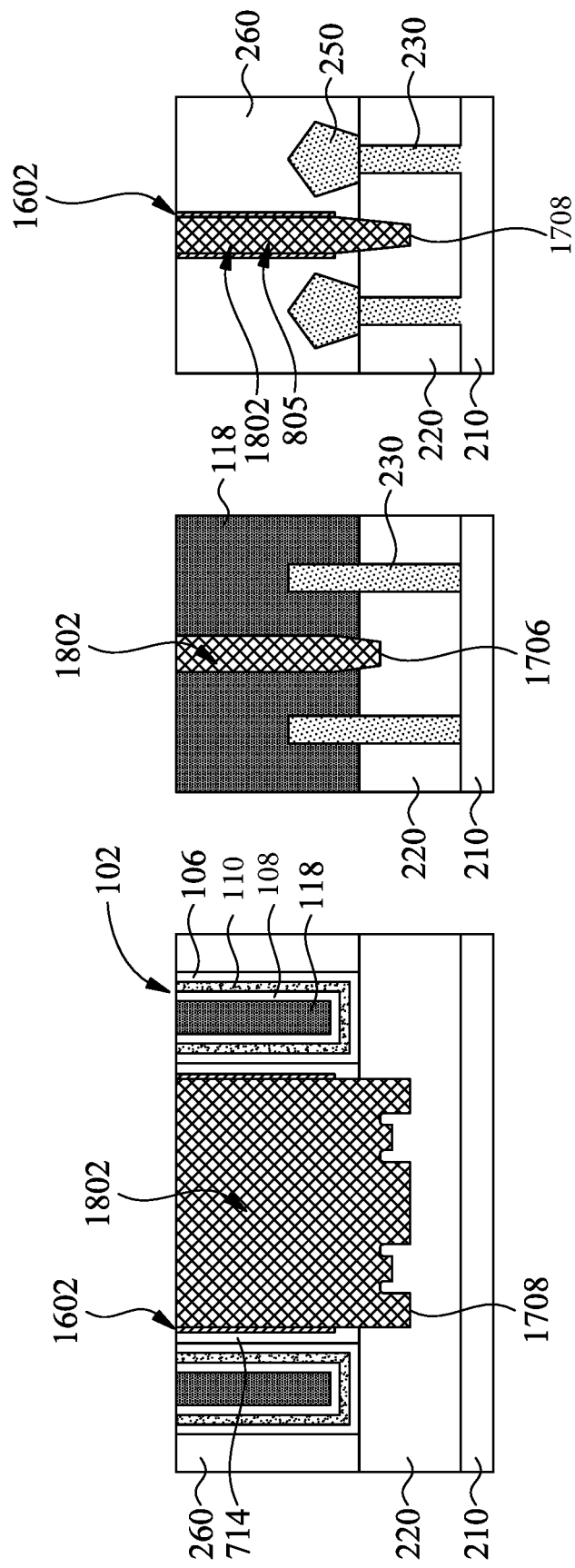
FIGS. 19A-19C depict cross sectional views of a semiconductor device structure at certain manufacturing stages of FIG. 15 in accordance with some embodiments.

At operation 1514, after the isolation structure 1802 is formed, a CMP process may be performed to polish back the excess dielectric materials utilized to form the isolation structure 1802 as well as to remove the first patterned mask structure 702, as shown in FIGS. 19A-19C, and provide a substantially planar top surface of the isolation structure 1802 relative to the top surface of the metal gate structure 102 and the ILD layer 260.

Similarly, the conformal liner layer 1602 (e.g., having functions and material properties similar to the edge portion 1102 of the dielectric structure 1002) lining on the edge portion 714 of the ILD layer 714 in combination is disposed around the perimeter of the opening 1750. The conformal liner layer 1602 formed in the opening 1750 may protect and provide the sidewalls of the areas interfaced with the openings 1750 with good protection and interface management. The opening 1750 divides and discontinues the longitudinal extension of the metal gate structures 102, forming sub-metal gate structures 102a, 102b having longitudinal lengths mismatched with the longitudinal lengths of the metal gate structures 102 as needed for different device performance requirements.

Figure 19D:
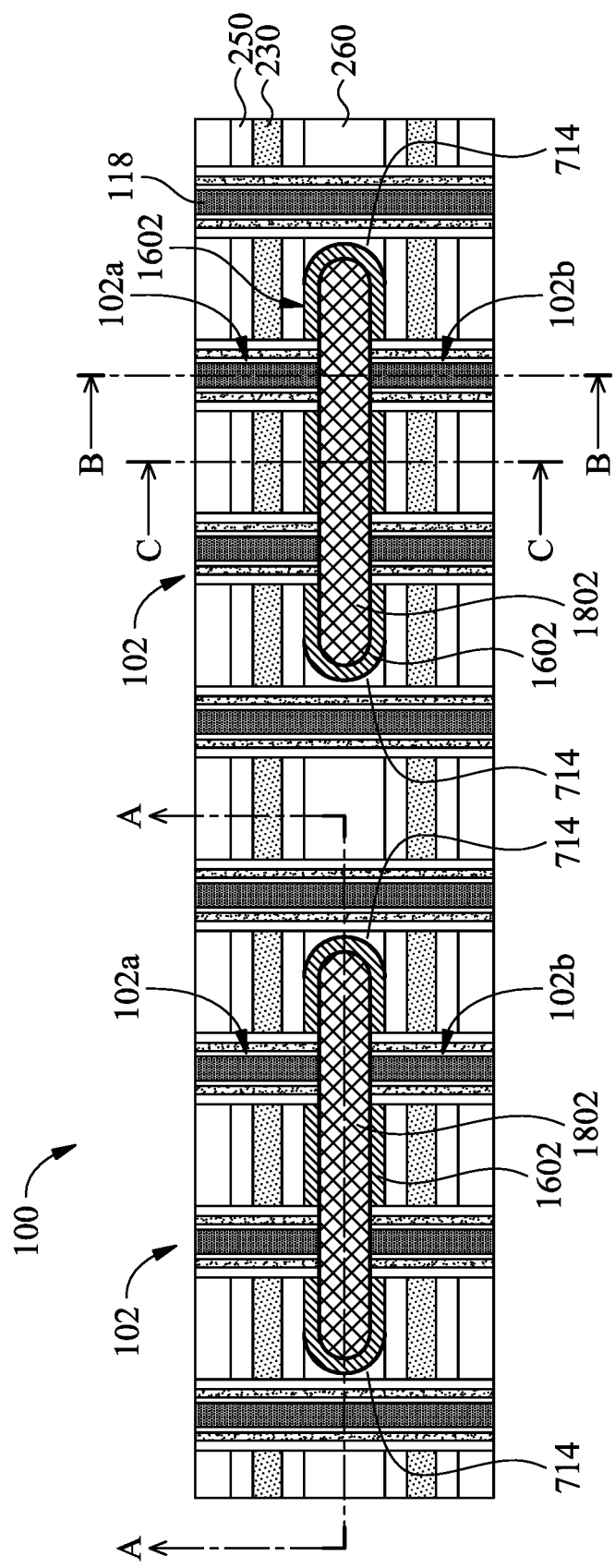
FIG. 19D depicts a top view of a semiconductor device structure at different manufacturing stages of FIG. 4 in accordance with some embodiments.

FIG. 19D depicts the top view of the semiconductor device structure 100 having the isolation structure 1802 filled in between the sub-metal gate structures 102a, 102b. Thus, a dual layer structure, including the conformal liner layer 1602 and the isolation structure 1802, as well as the edge portion 714 from the ILD layer 260 may be obtained to protect the structure of the metal gate structures and the ILD layers remained on the substrate while performing the metal gate structure cutting process. The isolation structure

1802 and the conformal liner layer 1602 as well as the edge portion 714 from the ILD 260, are formed between the metal gate structures 102 with good isolation properties. Thus, the opening 1750 (e.g., the line-cut) has the conformal liner layer 1602 circumscribing the isolation structure 1802. By utilizing the dual layer structure formed surrounding the opening 1750, a good interface management and isolation property may be obtained. Furthermore, the two step etching process (e.g., ILD recess etching and metal gate structure cutting process) may individually etch the metal materials and the insulating materials at different manufacturing stages, so that specific types of the etchants may be carefully selected as needed to enable successful etching process without undesired residuals and poor profile management.

Additional steps can be provided before, during, and after the processes 400, 1500, and some of the steps described can be replaced, eliminated, or performed in a different order as needed to complete and enable the processes 400, 1500. Other alternatives or embodiments may present without departure from the spirit and scope of the present disclosure.

It is noted that the semiconductor device structure 100 may undergo further CMOS or MOS technology processing to form various features and regions known in the art. For example, subsequent processing may form various contacts/vias/lines and multilayers interconnect features (e.g., metal layers and interlayer dielectrics) over the substrate 210, configured to connect the various features or structures of the FinFET semiconductor device structure 100. For example, a multilayer interconnection includes vertical interconnects, such as conventional vias or contacts, and horizontal interconnects, such as metal lines. The various interconnection features may implement various conductive materials including copper, tungsten, and/or silicide. In one example, a damascene and/or dual damascene process is used to form a copper related multilayer interconnection structure.

Although not intended to be limiting, one or more embodiments of the present disclosure provide many benefits to a semiconductor device and the formation thereof. For example, some embodiments of the present disclosure utilize a dual layer structure including an isolation structure and a dielectric structure (or a conformal liner layer) formed after a metal gate structure cutting process. Thus, a good interface management and isolation property may be obtained among the sub-gate metal structures. Furthermore, the two step etching process (e.g., ILD recess etching and metal gate structure cutting process) may individually etch the metal materials and the insulating materials at different manufacturing stages, so that specific types of the etchants may be carefully selected as needed to enable successful etching process without undesired residuals and poor profile management. The present disclosure provides many different embodiments of cutting the metal gate structure to fabricate sub-metal gate structures that provide one or more improvements over as needed.

In one example, a semiconductor device includes a plurality of metal gate structures disposed in an interlayer dielectric (ILD) layer disposed on a substrate, an isolation structure disposed between the metal gate structures, wherein the ILD layer circumscribes a perimeter of the isolation structure, and a dielectric structure disposed between the ILD layer and the isolation structure. In an embodiment, each of the metal gate structures includes a gate dielectric layer, a work function layer, and a metal gate electrode. In an embodiment, the dielectric structure includes a first material different from a second material of the isolation structure. In an embodiment, the first material of the dielectric structure is different from a third material of the ILD layer. In an embodiment, the dielectric structure is a conformal liner layer interfaced between the isolation structure and the ILD layer. In an embodiment, the isolation structure has a top surface and a bottom surface, wherein the bottom surface of the isolation structure has step heights, creating a varying depth across a body of the isolation structure. In an embodiment, an etch stop layer disposed between the isolation structure and ILD layer. In an embodiment, the metal gate structures on the substrate have mismatched dimensions.

In another embodiment, a method for manufacturing a semiconductor device structure includes forming a metal gate structure over a first fin structure and a second fin structure disposed on a substrate, wherein an interlayer dielectric (ILD) layer is formed between the first and the second fin structures, performing an ILD recess etching process to selectively form a recess in the ILD layer, forming a dielectric structure in the recess, performing a metal gate structure cutting process to form a line-cut that divides the metal gate structure into sub-metal gate structures, the line-cut further being formed at least partially in the dielectric structure, and forming an isolation structure in the line-cut. In an embodiment, a portion of the dielectric structure is removed while performing the metal gate structure cutting process. In an embodiment, a conformal liner layer is formed along a sidewall of the ILD layer and a bottom surface of the recess. In an embodiment, the recess is fully filled with the dielectric structure when forming a dielectric structure in the recess. In an embodiment, the dielectric structure has a first side interfaced with the ILD layer and a second side interfaced with the isolation structure. In an embodiment, the dielectric structure is fabricated from a first material different from a second material of the isolation structure. In an embodiment, the first material of the dielectric structure is different from a third material of the ILD layer.

In yet another embodiment, a method for manufacturing semiconductor device structure includes etching an interlayer dielectric (ILD) layer disposed on a substrate to form a recess in the ILD layer, wherein the recess is formed among a plurality of metal gate structures formed in the ILD layer, forming a dielectric structure in the recess, forming a line-cut in the plurality of metal gate structures to divide the metal gate structures into sub-metal gate structures, the line-cut being formed at least partially in the dielectric structure, and filling the line-cut with an isolation structure. In an embodiment, a portion of the dielectric structure is removed from the substrate. In an embodiment, a conformal liner layer is formed along a sidewall of the ILD layer and a bottom surface of the recess while forming the dielectric structure. In an embodiment, the recess is fully filled with the dielectric structure when forming the dielectric structure on the substrate. In an embodiment, the dielectric structure fully or partially circumscribes a perimeter of the isolation structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A semiconductor device, comprising:
a first gate structure and a second gate structure disposed in an interlayer dielectric (ILD) layer disposed on a substrate, wherein each of the first gate structure and the second gate structure comprises a gate dielectric and a gate electrode;
an isolation structure disposed between the first gate structure and the second gate structure, wherein the ILD layer circumscribes a perimeter of the isolation structure; and
a dielectric structure disposed between the ILD layer and the isolation structure, wherein a bottom surface of the isolation structure is closer to the substrate than a bottom surface of the dielectric structure, wherein the isolation structure directly contacts the gate electrode of the first gate structure.

2. The semiconductor device of claim 1, wherein the gate electrode of each of the first gate structure and the second gate structure comprises a work function layer.

3. The semiconductor device of claim 1, wherein the dielectric structure includes a first material different from a second material of the isolation structure.

4. The semiconductor device of claim 3, wherein the first material of the dielectric structure is different from a third material of the ILD layer.

5. The semiconductor device of claim 1, wherein the dielectric structure is a conformal liner layer interfaced between the isolation structure and the ILD layer.

6. The semiconductor device of claim 1, wherein the isolation structure has a top surface and a bottom surface, wherein the bottom surface of the isolation structure has step heights, creating a varying depth across a body of the isolation structure.

7. The semiconductor device of claim 1, further comprising:
an etch stop layer disposed between the isolation structure and ILD layer.

8. The semiconductor device of claim 1, wherein the first gate structure and the second gate structure on the substrate have mismatched dimensions.

9. A semiconductor device, comprising:
a first gate structure and a second gate structure;
a first isolation structure interposed between an end of the first gate structure and an end of the second gate structure, wherein the first isolation structure extends over a shallow trench isolation interposed between two fins, wherein the first isolation structure has a first thickness at a first location and has a second thickness at a second location, wherein the first thickness is less than the second thickness;
a second isolation structure along opposing sidewalls of the first gate structure and the second gate structure; and
a third isolation structure interposed between the first isolation structure and the second isolation structure, wherein the third isolation structure does not separate the first isolation structure from the first gate structure.

10. The semiconductor device of claim 9, wherein the second isolation structure does not extend between the first isolation structure and the first gate structure, and wherein the second isolation structure does not extend between the first isolation structure and the second gate structure.

11. The semiconductor device of claim 9, wherein the first isolation structure extends lower than the third isolation structure.

12. The semiconductor device of claim 11, wherein the first isolation structure extends lower than the second isolation structure.

13. The semiconductor device of claim 12, wherein the first isolation structure contacts the second isolation structure below the third isolation structure.

14. The semiconductor device of claim 9, wherein the first isolation structure contacts the first gate structure and the second gate structure.

15. A semiconductor device, comprising:
a first transistor including a first source/drain region, a second source/drain region, a first gate structure extending along sidewalls of a first fin, the first gate structure extending over a first shallow trench isolation;
a second transistor including a third source/drain region, a fourth source/drain region, a second gate structure extending along sidewalls of a second fin, the second gate structure extending over the first shallow trench isolation, the first gate structure and the second gate structure being aligned along a first longitudinal axis;
a first isolation structure contacting the first gate structure and the second gate structure;
a second isolation structure over the first source/drain region and the third source/drain region; and
a third isolation structure interposed between the first isolation structure and the first source/drain region and between the first isolation structure and the third source/drain region, the third isolation structure extending along a sidewall of the first isolation structure, the sidewalls of the first isolation structure being parallel to current flow between the first source/drain region and the second source/drain region.

16. The semiconductor device of claim 15, wherein a bottom surface of the first isolation structure contacts the third isolation structure.

17. The semiconductor device of claim 15, wherein a bottom surface of the first isolation structure contacts the first shallow trench isolation.

18. The semiconductor device of claim 15, wherein at least a portion of the third isolation structure is interposed between a bottom surface of the first isolation structure and the first shallow trench isolation.

19. The semiconductor device of claim 15, wherein a bottom surface of the first isolation structure comprises a plurality of projections.

20. The semiconductor device of claim 9, further comprising an isolation region, wherein the first gate structure and the second gate structure extends over the isolation region, wherein the first isolation structure directly contacts the isolation region.

* * * * *